United States Patent
Flemming et al.

(10) Patent No.: US 11,342,896 B2
(45) Date of Patent: May 24, 2022

(54) 2D AND 3D RF LUMPED ELEMENT DEVICES FOR RF SYSTEM IN A PACKAGE PHOTOACTIVE GLASS SUBSTRATES

(71) Applicant: 3D Glass Solutions, Inc., Albuquerque, NM (US)

(72) Inventors: Jeb H. Flemming, Albuquerque, NM (US); Jeff A. Bullington, Albuquerque, NM (US); Kyle McWethy, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 176 days.

(21) Appl. No.: 16/622,421

(22) PCT Filed: Jun. 27, 2018

(86) PCT No.: PCT/US2018/039841
§ 371 (c)(1),
(2) Date: Dec. 13, 2019

(87) PCT Pub. No.: WO2019/010045
PCT Pub. Date: Jan. 10, 2019

(65) Prior Publication Data
US 2020/0212864 A1    Jul. 2, 2020

Related U.S. Application Data

(60) Provisional application No. 62/529,990, filed on Jul. 7, 2017.

(51) Int. Cl.
*H03H 3/00*    (2006.01)
*H03H 7/52*    (2006.01)
(Continued)

(52) U.S. Cl.
CPC ............ *H03H 3/00* (2013.01); *H01P 11/003* (2013.01); *H03H 7/1741* (2013.01); *H03H 7/52* (2013.01); *H03H 2001/0021* (2013.01)

(58) Field of Classification Search
CPC .......... H03H 7/1741; H03H 7/52; H03H 3/00; H01P 11/003
(Continued)

(56) References Cited

U.S. PATENT DOCUMENTS 2,515,940 A    7/1950  Stookey
2,515,941 A    7/1950  Stookey
(Continued)

FOREIGN PATENT DOCUMENTS

CN    1562831 A    4/2004
CN    105938928    9/2016
(Continued)

OTHER PUBLICATIONS

Dang, et al. "Integrated thermal-fluidic I/O interconnects for an on-chip microchannel heat sink," IEEE Electron Device Letters, vol. 27, No. 2, pp. 117-119, 2006.
(Continued)

*Primary Examiner* — Rakesh B Patel
(74) *Attorney, Agent, or Firm* — Edwin S. Flores; Chalker Flores, LLP

(57) ABSTRACT

The present invention includes a method for creating a system in a package with integrated lumped element devices is system-in-package (SiP) or in photo-definable glass, comprising: masking a design layout comprising one or more electrical components on or in a photosensitive glass substrate; activating the photosensitive glass substrate, heating and cooling to make the crystalline material to form a glass-crystalline substrate; etching the glass-crystalline substrate; and depositing, growing, or selectively etching a seed
(Continued)

TOP VIEW OF THE INTERDIGITATED CAPACITOR

CROSS SECTIONAL VIEW OF INDUCTOR layer on a surface of the glass-crystalline substrate on the surface of the photodefinable glass, wherein the integrated lumped element devices reduces the parasitic noise and losses by at least 25% from a package lumped element device mount to a system-in-package (SiP) in or on photodefinable glass when compared to an equivalent surface mounted device.

32 Claims, 19 Drawing Sheets

(51) Int. Cl.
*H01P 11/00* (2006.01)
*H03H 7/01* (2006.01)
*H03H 1/00* (2006.01)

(58) Field of Classification Search
USPC .................................................. 333/181, 185
See application file for complete search history.

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,281,264 A | 10/1966 | Cape et al. |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borelli et al. |
| 4,537,612 A | 8/1985 | Borelli et al. |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | DiPaolo et al. |
| 5,352,996 A | 10/1994 | Kawaguchi |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,495,411 B1 | 12/2002 | Mei |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,686,824 B1 | 2/2004 | Yamamoto et al. |
| 6,771,860 B2 | 8/2004 | Trezza et al. |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 10,070,533 B2 | 9/2018 | Flemming et al. |
| 10,201,901 B2 | 2/2019 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0150683 A1 | 7/2005 | Farnworth et al. |
| 2005/0170670 A1 | 8/2005 | King et al. |
| 2005/0212432 A1 | 9/2005 | Neil et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0245109 A1 | 10/2008 | Flemming et al. |
| 2008/0291442 A1 | 11/2008 | Lawandy |

(56) References Cited

U.S. PATENT DOCUMENTS

| | | |
|---|---|---|
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemming et al. |
| 2010/0059265 A1 | 3/2010 | Myung-Soo |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamagaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2019/0280079 A1 | 7/2019 | Bouvier et al. |
| 2020/0275558 A1 | 8/2020 | Fujita |

FOREIGN PATENT DOCUMENTS

| | | |
|---|---|---|
| CN | 210668058 U | 6/2020 |
| DE | 102004059252 A1 | 1/2006 |
| EP | 0311274 A1 | 12/1989 |
| EP | 0507719 A1 | 10/1992 |
| EP | 0685857 B1 | 12/1995 |
| EP | 0949648 A1 | 10/1999 |
| EP | 1683571 A1 | 6/2006 |
| JP | 56-155587 | 12/1981 |
| JP | 61149905 | 7/1986 |
| JP | 61231529 A | 10/1986 |
| JP | 62202840 A | 9/1987 |
| JP | 63-128699 A | 6/1988 |
| JP | 08026767 A | 6/1988 |
| JP | H393683 A | 4/1991 |
| JP | 05139787 A | 6/1993 |
| JP | 08179155 A | 12/1994 |
| JP | 10007435 A | 1/1998 |
| JP | 10199728 A | 7/1998 |
| JP | 11344648 A | 12/1999 |
| JP | 2000228615 A | 8/2000 |
| JP | 2001033664 A | 2/2001 |
| JP | 2001206735 A | 7/2001 |
| JP | 2005302987 A | 10/2005 |
| JP | 2005215644 A | 11/2005 |
| JP | 2006179564 A | 6/2006 |
| JP | 2008252797 A | 10/2008 |
| JP | 2012079960 A | 4/2012 |
| JP | 2013062473 A | 4/2013 |
| JP | 2013217989 A | 10/2013 |
| JP | 2014241365 A | 12/2014 |
| JP | 2015028651 | 2/2015 |
| JP | 2015028651 A | 2/2015 |
| JP | H08026767 A | 1/2016 |
| JP | 2018200912 A | 12/2018 |
| KR | 100941691 B1 | 2/2010 |
| KR | 101167691 B1 | 7/2012 |
| WO | 2007088058 A1 | 8/2007 |
| WO | 2008119080 A1 | 10/2008 |
| WO | 2008154931 A1 | 12/2008 |
| WO | 2009029733 A2 | 3/2009 |
| WO | 2009062011 A1 | 5/2009 |
| WO | 2009126649 A2 | 10/2009 |
| WO | 2010011939 A2 | 1/2010 |
| WO | 2011100445 A1 | 8/2011 |
| WO | 2011109648 A1 | 9/2011 |
| WO | 2012078213 A1 | 6/2012 |
| WO | 2014062226 A1 | 1/2014 |
| WO | 2014043267 A1 | 3/2014 |
| WO | 2014062311 A1 | 4/2014 |
| WO | 2015108648 A1 | 7/2015 |
| WO | 2015112903 A1 | 7/2015 |
| WO | 2015171597 A1 | 11/2015 |
| WO | 2017132280 A2 | 8/2017 |
| WO | 2017147511 A1 | 8/2017 |
| WO | 2017177171 A1 | 10/2017 |
| WO | 2018200804 A1 | 1/2018 |
| WO | 2019010045 A1 | 1/2019 |
| WO | 2019118761 A1 | 6/2019 |
| WO | 2019136024 A1 | 7/2019 |
| WO | 2019199470 A1 | 10/2019 |
| WO | 2019231947 A1 | 12/2019 |

OTHER PUBLICATIONS

Dietrich, T.R., et al., "Fabrication Technologies for Microsystems Utilizing Photoetchable Glass," Microelectronic Engineering 30, (1996), pp. 407-504.

Extended European Search Report 15741032.5 dated Aug. 4, 2017, 11 pp.

Extended European Search Report 15789595.4 dated Mar. 31, 2017, 7 pp.

Extended European Search Report 17744848.7 dated Oct. 30, 2019, 9 pp.

Extended European Search Report 17757365.6 dated Oct. 14, 2019, 14 pp.

Geddes, et al., "Metal-Enhanced Fluorescence" J Fluorescence, (2002), 12:121-129.

Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.

Intel Corporation, "Intel® 82566 Layout Checklist (version 1.0)", 2006.

International Search Report and Written Opinion for PCT/US2008/058783 dated Jul. 1, 2008, 15 pp.

(56) References Cited

OTHER PUBLICATIONS

International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
International Search Report and Written Opinion for PCT/US2020/28474 dated Jul. 17, 2020 by the USPTO, 7 pp.
International Search Report and Written Opinion for PCT/US2021/27499 dated Jun. 16, 2021 by the USPTO, 7 pp.
International Search Report and Written Opinion for PCT/US2021/21371 dated May 20, 2021 by the USPTO, 10 pp.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
Aslan, et al, "Metal-Enhanced Fluorescence: an emerging tool in biotechnology" Current opinion in Biotechnology (2005), 16:55-62.
Azad, I., et al., "Design and Performance Analysis of 2.45 GHz Microwave Bandpass Filter with Reduced Harmonics," International Journal of Engineering Research and Development (2013), 5(11):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211 Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
International Search Report and Written Opinion for PCT/US2020/54394 dated Jan. 7, 2021 by the USPTO, 15 pp.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.

(56) References Cited

OTHER PUBLICATIONS

International Search Report and Written Opinion for PCT/US2020/026673 dated Jun. 22, 2020, by the USPTO, 13 pp.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.

2D AND 3D RF LUMPED ELEMENT DEVICES FOR RF SYSTEM IN A PACKAGE PHOTOACTIVE GLASS SUBSTRATES

CROSS-REFERENCE TO RELATED APPLICATIONS

This application is the National Stage of International Application No. PCT/US2018/039841, filed on Jun. 27, 2018 claiming the priority to U.S. Provisional Application No. 62/529,990 filed on Jul. 7, 2017, the contents of each of which are incorporated by reference herein.

STATEMENT OF FEDERALLY FUNDED RESEARCH

None.

TECHNICAL FIELD OF THE INVENTION

The present invention relates in general to the field of RF lumped element devices for RF system in a package photoactive glass substrates.

BACKGROUND OF THE INVENTION

Without limiting the scope of the invention, its background is described in connection with RF lumped element devices.

Photosensitive glass structures have been suggested for a number of micromachining and microfabrication processes such as integrated electronic elements in conjunction with other elements systems or subsystems. Silicon microfabrication of traditional glass is expensive and low yield while injection modeling or embossing processes produce inconsistent shapes. Silicon microfabrication processes rely on expensive capital equipment; photolithography and reactive ion etching or ion beam milling tools that generally cost in excess of one million dollars each and require an ultra-clean, high-production silicon fabrication facility costing millions to billions more. Injection molding and embossing are less costly methods of producing a three dimensional shapes but generate defects with in the transfer or have differences due to the stochastic curing process. Ideal inductors would have zero resistance and zero capacitance. But, real inductors have "parasitic" resistance, inductors and capacitance.

Historically, inductor capacitance is called "inter-winding capacitance" based on the assumption that it is the result of charge separation between insulated coil windings. However, if the inductor is measured over a conducting ground plane, capacitance between the coil and the ground plane is also part of the measurement. The distance of the coil from the measurement ground plane and the effective dielectric constant of the measurement substrate affects the capacitance to ground. This partially explains how the test fixture affects the SRF measurement. The following equation shows how the SRF is related to inductance and capacitance in an LC circuit:

$$SRF = \frac{1}{2\pi\sqrt{(LC)}} \text{ in Hz}$$

where: L is the inductance in Henries, and C is the capacitance in Farads.

In addition to the additional inductance, capacitance and resistance eliminate losses from: (1) PCB interconnects; (2) Long metal redistribution line lengths; (3) Bond pads; (4) Solder balls; (5) Substrate losses and dielectric constant/loss tangent; and/or (6) inconsistent assembly.

From this equation, it is clear that in general, RF and/or microwave filters are made up of one or more coupled resonators and several different technologies can be used to make resonators/filters. The majority of the resonators/filters fall into one of three general categories: Lumped-Element, Microstrip Transmission Lines, and Coaxial Waveguide.

Lumped-element or inductor capacitor (LC) filters are the simplest resonator structure used in RF and microwave filters and other devices. Lumped-element circuit consisting of parallel or series inductors and capacitors. An advantage of a lumped-element filters/devices is that they can be very compact but the disadvantages are that they have a low quality factor, large level of distortion/noise and relatively poor performance. As such lumped-element devices are not consider a viable option in RF/Microwave applications.

In the book Lumped Elements for RF and Microwave Circuits by Inder Bahl published in 2003 it is stated that, lain ideal lumped element is not realizable even at lower microwave frequencies because of the associated parasitic reactances due to fringing fields. At RF and microwave frequencies, each component has associated electric and magnetic fields and finite dissipative loss. Thus, such components store or release electric and magnetic energies across them and their resistance accounts for the dissipated power. The relative values of the C, L, and R components in these elements depend on the intended use of the LE. To describe their electrical behavior, equivalent circuit models for such components are commonly used. Lumped element equivalent circuit (EC) models consist of basic circuit elements (L, C, or R) with the associated parasitics denoted by subscripts. Accurate computer-aided design of MICs and MMICs requires a complete and accurate characterization of these components. This requires comprehensive models including the effect of ground plane, fringing fields, proximity effects, substrate material and thickness, conductor thickness, and associated mounting techniques and applications. Thus, an EC representation of a lumped element with its parasitics and their frequency-dependent characteristics is essential for accurate element modeling. An EC model consists of the circuit elements necessary to fully describe its response, including resonances, if any. Models can be developed using analytical, electromagnetic simulation, and measurement based methods. The early models of lumped elements were developed using analytical semiempirical equations. In 1943, Terman published an expression for the inductance of a thin metallic straight line that was later improved by Caulton et al., who added the effect of metallization thickness. Wheeler presented an approximate formula for the inductance of a circular spiral inductor with reasonably good accuracy at lower microwave frequencies. This formula has been extensively used in the design of microwave lumped circuits. Others have discussed inductance calculations for several geometries. The theoretical modeling of microstrip inductors for MICs has usually been based on two methods: the lumped-element approach and the coupled-line approach. The lumped-element approach uses formulas for free-space inductance with ground plane effects. These frequency-independent formulas are useful only when the total length of the inductor is a small fraction of the operating wavelength and when interturn capacitance can be ignored. In the coupled-line approach, an inductor is analyzed using multiconductor coupled microstrip lines. This 10 Lumped Elements for RF and Microwave Circuits technique predicts the spiral inductor's performance reasonably well for two turns and up to about 18 GHz. An earlier theory for the interdigital capacitor was published by Alley, and Joshi et al. presented modified formulas for these capacitors. Mondal reported a distributed model of the MIM capacitor based on the coupled-line approach. Pengelly et al. presented the first extensive results on different lumped elements on GaAs, including inductors and interdigital capacitors, with special emphasis on the Q-factor. Pettenpaul et al. reported lumped-element models using numerical solutions along with basic microstrip theory and network analysis. In general, analytical models are good for estimating the electrical performance of lumped elements. The realization of lumped L, C, R elements at microwave frequencies is possible by keeping the component size much smaller than the operating wavelength. However, when the component size becomes greater than 1/10, these components have undesirable associated parasitics such as resistance, capacitance, and inductance. At RF and higher frequencies, the reactances of the parasitics become more significant, with increasing frequency resulting in higher loss and spurious resonances. Thus, empirical expressions are not accurate enough to predict LE performance accurately. Once lumped elements are accurately characterized either by electromagnetic (EM) simulation or measurements, the parasitic reactances become an integral part of the component and their effects can be included in the design.

Recent advances in workstation computing power and user-friendly software make it possible to develop EM field simulators. These simulators play a significant role in the simulation of single and multilayer passive circuit elements such as transmission lines and their discontinuities; patches; multilayer components, namely, inductors, capacitors, resistors, via holes, airbridges, inductor transformers, packages, and so on; and passive coupling between various circuit elements. Accurate evaluation of the effects of radiation, surface waves and interaction between components on the performance of densely packed Monolithic Microwave Integrated Circuits (MMICs) can only be calculated using three-dimensional (3-D) EM simulators. The most commonly used method of developing accurate models for lumped elements is by measuring dc resistance and S-parameter data. This modeling approach gives quick and accurate results, although the results are generally limited to just the devices measured. EC model parameters are extracted by computer optimization, which correlates the measured dc and S-parameter data (one- or two-port data) up to 26 or 40 GHz depending on the application. The accuracy of the model parameter values can be as good as the measurement accuracy by using recently developed on-wafer calibration standards and techniques. The equivalent circuit models are valid mostly up to the first parallel resonant frequency ($f_{res}$). However, when a design is involved with harmonics, for example, a power amplifier with second and third harmonic terminations at the output, one requires either EM simulated data working up to the highest design frequency or a more complex model taking into account higher order resonances. If the operating frequency is lower than $f_{res}/3$, then the models discussed above are adequate. At RF and microwave frequencies, the resistance of LEs is quite different from their dc values due to the skin effect. When an RF signal is applied across a LE, due to the finite conductivity of the conductor material, EM fields penetrate a conductor only a limited depth along its cross section. The distance in the conductor over which the fields decrease to 1/e (about 36.9%) of the values at the surface is called depth of penetration, or skin depth. This effect is a function of frequency with the penetration depth decreasing with increasing frequency. The flow of RF current is limited to the surface only, resulting in higher RF surface resistance than the dc value. This effect is taken into account during accurate modeling of the resistive loss in the component.

Microstrip transmission lines, also known as a stripline, can make good resonators/filters and offer a better compromise in terms of size and performance than lumped element filters. The processes used to manufacture microstrip circuits is very similar to the processes used to manufacture printed circuit boards using a precision thin-film process but require using quartz, ceramic, sapphire substrates and lower resistance metals such as gold to obtain the performance required for low power/loss RF applications.

Coaxial Waveguide (CW) filters provide higher Q factor than planar transmission lines, and are used in high performance RF applications. The coaxial resonators may make use of high-dielectric constant materials to reduce their size. The size of CW filter scale inversely to the frequency the size can reach to less than 2 cm$^2$ at frequencies above 30 GHz on a ceramic substrate. The combination of a ceramic substrate and the physical size prevents the filter makes these filters expensive and large relative to other RF filters from and as such are not generally used in commercial portable, compact RF products.

One of the most common RF filters are surface acoustic wave (SAW) and/or bulk acoustic wave (BAW). Both SAW and BAW exhibit decreased signal to noise ratios as the frequency of operation exceeds the speed of sound in the piezoelectric material. Single crystal BAW devices have been shown to have higher performance but also suffer from a dramatic collapse of the signal to noise when the frequencies exceed the speed of sound of the piezoelectric material. The speed of sound of the piezoelectric material used in SAW and BAW filters limits their application to frequencies less than 3 GHz.

Despite all of these advances, a need remains for improvements to existing devices that have increased signal to noise ratio, that are easy and inexpensive to build, and that eliminate losses from: (1) PCB interconnects; (2) Long metal redistribution line lengths; (3) Bond pads; (4) Solder balls; (5) Substrate losses and dielectric constant/loss tangent; and/or (6) inconsistent assembly.

SUMMARY OF THE INVENTION

In one embodiment, the present invention includes a method for creating a system in a package with integrated lumped element devices formed as a system-in-package (SiP) in or on photo-definable glass comprising the steps of: masking a design layout comprising one or more structures to form one or more electrical components on or in a photosensitive glass substrate; exposing at least one portion of the photosensitive glass substrate to an activating energy source; heating the photosensitive glass substrate for at least ten minutes above its glass transition temperature; cooling the photosensitive glass substrate to transform at least a part of the exposed glass to a crystalline material to form a glass-crystalline substrate; etching the glass-crystalline substrate with an etchant solution to form one or more channels in the device, wherein the glass-crystalline substrate adjacent to the trenches, which may optionally be converted to a ceramic phase; and depositing, growing, or selectively etching a seed layer on a surface of the glass-crystalline substrate exposed during the etching step to enable electroplating of copper to fill the trenches and deposit on the surface of the photodefinable glass, wherein the integrated lumped element devices reduces the parasitic noise and losses by at least 25% from a package lumped element device mount to a system-in-package (SiP) in or on photo-definable glass when compared to an equivalent surface mounted device. In one aspect, the method further comprises forming an isolator with integrated lump element devices is in a SiP. In another aspect, the method further comprises forming a circulator with integrated lump element devices in a SiP. In another aspect, the method further comprises forming an RF filter with integrated lump element devices in a SiP. In another aspect, the method further comprises forming at least one of a low pass, high pass filter, notch filter, band pass filter, transformer, circulator, isolator, with integrated lump element devices in a SiP. In another aspect, the method further comprises forming a power combiner, a power splitter RF Circuit in or on the photo-definable glass substrate. In another aspect, the method further comprises forming an SiP RF Circuit that eliminates at least 30% of the RF parasitic signal loss when compared to an equivalent surface mounted device. In another aspect, the method further comprises forming an SiP RF Circuit that eliminates at least 35% of the RF parasitic signal loss when compared to an equivalent surface mounted device (the loss associated with the packaging a mount elements to a substrate). In another aspect, the method further comprises forming an SiP RF Circuit that eliminates at least 50% of the RF parasitic signal loss when compared to an equivalent surface mounted device. In another aspect, the method further comprises forming one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, and/or Diplexors.

Another embodiment of the present invention includes a package lumped element device mount to a system-in-package (SiP) in or on photo-definable glass made by the method described hereinabove. In one aspect, the device is an isolator with integrated lump element devices and is in a SiP. In another aspect, the device is a circulator with integrated lump element devices and is in a SiP. In another aspect, the device is an RF filter with integrated lump element devices and is in a SiP. In another aspect, the device is at least one of a low pass, high pass filter, notch filter, band pass filter, transformer, circulator, isolator, with integrated lump element devices and is in a SiP. In another aspect, the device is a power combiner, a power splitter RF Circuit in or on the photo-definable glass substrate. In another aspect, the device is a SiP RF Circuit that eliminates at least 30% of the RF parasitic signal loss when compared to an equivalent surface mounted device. In another aspect, the device is a SiP RF Circuit that eliminates at least 35% of the RF parasitic signal loss when compared to an equivalent surface mounted device. In another aspect, the method further comprises forming an SiP RF Circuit that eliminates at least 50% of the RF parasitic signal loss when compared to an equivalent surface mounted device. In another aspect, the device is one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, and/or Diplexors.

In yet another embodiment, the present invention includes a method for creating a system in a package with integrated lumped element devices formed as a system-in-package (SiP) in or on photo-definable glass comprising the steps of: masking a design layout comprising one or more structures to form one or more electrical components on or in a photosensitive glass substrate; transforming at least a part of the exposed glass to a crystalline material to form a glass-crystalline substrate; etching the glass-crystalline substrate with an etchant solution to form one or more channels in the device, wherein the glass-crystalline substrate adjacent to the trenches, which may optionally be converted to a ceramic phase; and depositing, growing, or selectively etching a seed layer on a surface of the glass-crystalline substrate exposed during the etching step to enable electroplating of copper to fill the trenches and deposit on the surface of the photodefinable glass, wherein the integrated lumped element devices reduces the parasitic noise and losses by at least 25% from a package lumped element device mount to a system-in-package (SiP) in or on photo-definable glass when compared to an equivalent surface mounted device. In one aspect, the method further comprises forming an isolator with integrated lump element devices is in a SiP. In another aspect, the method further comprises forming a circulator with integrated lump element devices in a SiP. In another aspect, the method further comprises forming an RF filter with integrated lump element devices in a SiP. In another aspect, the method further comprises forming at least one of a low pass, high pass filter, notch filter, band pass filter, transformer, circulator, isolator, with integrated lump element devices in a SiP. In another aspect, the method further comprises forming a power combiner, a power splitter RF Circuit in or on the photo-definable glass substrate. In another aspect, the method further comprises forming an SiP RF Circuit that eliminates at least 30% of the RF parasitic signal loss when compared to an equivalent surface mounted device. In another aspect, the method further comprises forming an SiP RF Circuit that eliminates at least 35% of the RF parasitic signal loss when compared to an equivalent surface mounted device. In another aspect, the method further comprises forming an SiP RF Circuit that eliminates at least 50% of the RF parasitic signal loss when compared to an equivalent surface mounted device. In another aspect, the method further comprises forming one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, and/or Diplexors.

Another embodiment of the present invention includes a package lumped element device mount to a system-in-package (SiP) in or on photo-definable glass made by the method described hereinabove. In one aspect, the device is an isolator with integrated lump element devices and is in a SiP. In another aspect, the device is a circulator with integrated lump element devices and is in a SiP. In another aspect, the device is an RF filter with integrated lump element devices and is in a SiP. In another aspect, the device is at least one of a low pass, high pass filter, band pass filter, transformer, circulator, isolator, with integrated lump element devices and is in a SiP. In another aspect, the device is a power combiner, a power splitter RF Circuit in or on the photo-definable glass substrate. In another aspect, the device is a SiP RF Circuit that eliminates at least 30% of the RF parasitic signal associated with the packaging a mount elements to a substrate. In another aspect, the device is a SiP RF Circuit that eliminates at least 35% of the RF parasitic signal associated with the packaging a mount elements to a substrate. In another aspect, the device is one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, and/or Diplexors.

BRIEF DESCRIPTION OF THE DRAWINGS

For a more complete understanding of the features and advantages of the present invention, reference is now made to the detailed description of the invention along with the accompanying figures and in which.

The SiP is approximately 0.5 cm×0.5 cm.

Figure 13:
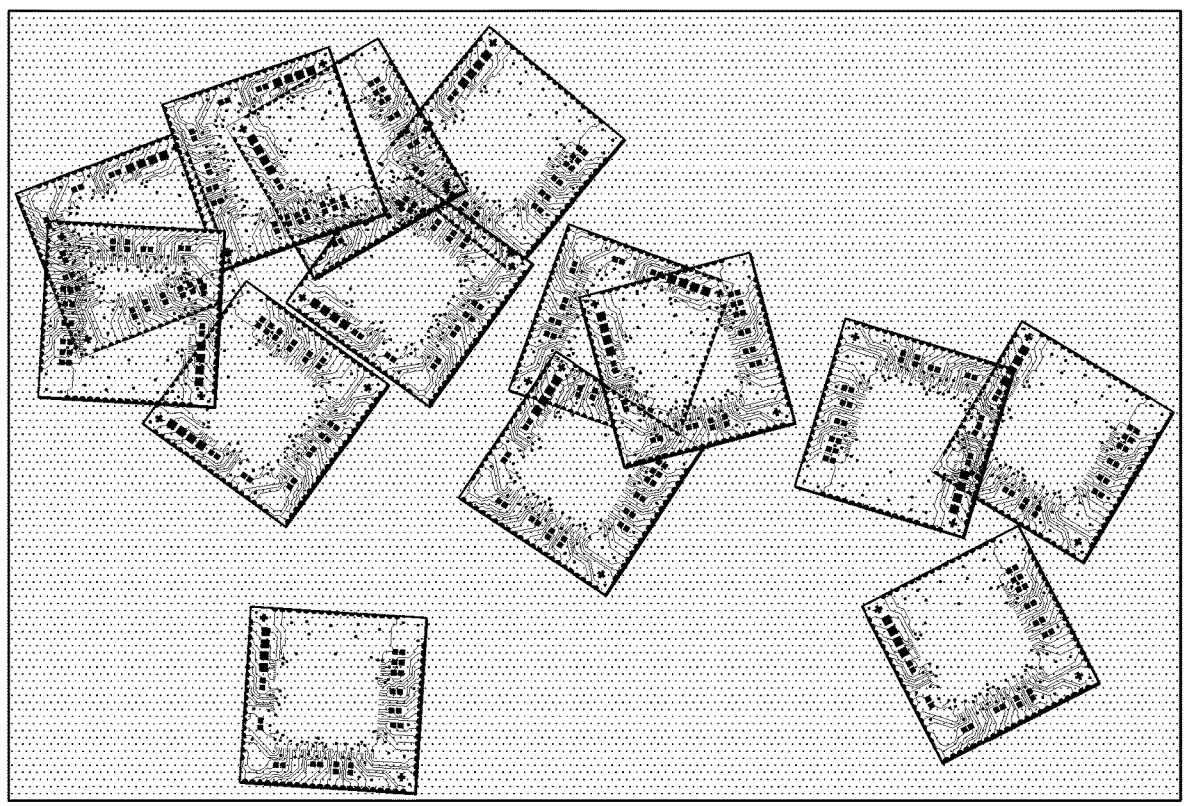

FIG. 13 shows a sampling of glass based SiP with integrated lumped element devices of the present invention. Depending of size of the SiP there can be a great number of SiPs on a single wafer.

FIGS. 14A-14F show the process of making devices using the present invention.

FIGS. 15A-15F show further processing steps for making a device using the present invention.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

The present invention eliminates the parasitic losses and signals associated with lumped element devices in the RF domain. Lumped element devices or an array of lumped element devices consist of capacitors, inductors, and resistors to implement a wide number of electronic devices and functions including: filters (band-pass, band-stop, high-pass, notch, low-pass filter), circulators, antenna, power conditioning, power combiner, power splitter, matching networks, isolators and/or Doherty power amplifier in photo definable glass ceramic system in a package (SiP) for microwave and radiofrequency that eliminates or greatly reduce parasitic signals or losses. The parasitic signals or losses are generated from the antenna effects combined with the inductance, capacitance and resistance from the packaging, solder bonding (ball grid), electronic connectors (wire), electrical bond pads and mounting elements that attach the packaged lumped element devices to the SiP. The distorted signals or losses are transmitted to other RF devices on the printed circuit board or substrate. There is sufficient variation in the traditional packaged and mounting of lumped elements to create large performance variations from the actual intended performance. These variations appear to be random due to the subtle differences in the packaging that force RF products to endure a large number of design iterations and/or manual trimming/correction to create a final RF circuit that meets the desired operating envelop. Eliminating the distortion associated with the RF packaging and the mounting elements allows the RF filter device to preform as designed/simulated. Integrating lumped element devices into a photodefinable glass ceramic SiP enables the circuit to preform as designed and simulated through the entire RF spectrum. These lumped element device structures consist of both the vertical as well as horizontal planes either separately or at the same time to form two or three-dimensional lumped element devices with design to device parity, lower loss, low signal distortion, reduced parasitic capacitance, reduced cost, and smaller physical size.

As described in the background, photosensitive glass structures have been suggested for a number of micromachining and microfabrication processes such as integrated electronic elements in conjunction with other elements systems or subsystems. The present invention has advantages over silicon microfabrication of traditional glass that is expensive and low yield while injection modeling or embossing processes produce inconsistent shapes. The present invention has additional advantages over silicon microfabrication processes that rely on expensive capital equipment; photolithography and reactive ion etching or ion beam milling tools that generally cost in excess of one million dollars each and require an ultra-clean, high-production silicon fabrication facility costing millions to billions more. The present invention also overcomes the problems with injection molding and embossing that generate defects with in the transfer or have differences due to the stochastic curing process. Ideal inductors would have zero resistance and zero capacitance. But, real inductors have "parasitic" resistance, inductors and capacitance. The first self-resonant frequency of an inductor is the lowest frequency at which an inductor resonates with its self-capacitance. The first resonance can be modeled by a parallel combination of inductance and capacitance. A resistor "R1" limits impedance near the resonant frequency at the self-resonant frequency (SRF) of an inductor, all of the following conditions are met: (1) The input impedance is at its peak; (2) the phase angle of the input impedance is zero, crossing from positive (inductive) to negative (capacitive); (3) since the phase angle is zero, the Q is zero; (4) the effective inductance is zero, since the negative capacitive reactance (Xc=1/jωk) just cancels the positive inductive reactance (XL=jωL); (5) the 2-port insertion loss (e.g. S21 dB) is a maximum, which corresponds to the minimum in the plot of frequency vs. S21 dB; and (6) the 2-port phase (e.g. S21) angle is zero, crossing from negative at lower frequencies to positive at higher frequencies.

To address these needs, the present inventors developed a glass ceramic (APEX® Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. The APEX® Glass ceramic enables the creation of an SiP that includes one or part of the following: easily fabricated high density vias, electronic devices including; Inductors, Capacitors, Resistors, Transmission Lines, Coax Lines, Antenna, Microprocessor, Memory, Amplifier, Transistors, matching networks, RF Filters, RF Circulators, RF Isolators, Impedance Matching Elements, 50 Ohm Termination Elements, Integrated Ground Planes, RF Shielding Elements, EMI Shielding Elements, RF Combiners, RF Splitters, Transformers, Switches, Multiplexors, and/or Diplexers.

Figure 1A:
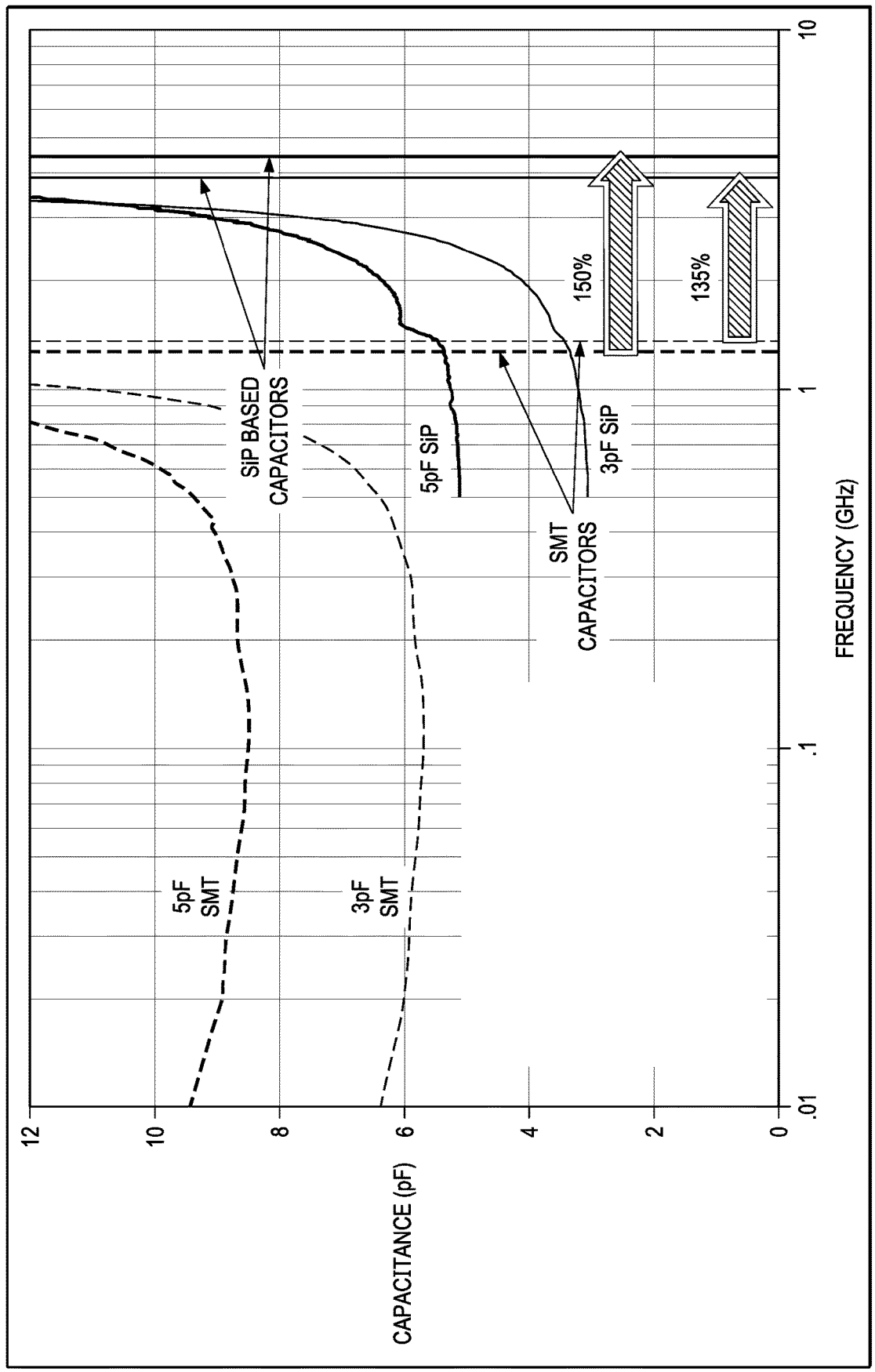
FIG. 1A is a graph that shows the impact of the parasitic signals/losses capacitance on the performance of a capacitor in a system in a package (SiP) vs a Surface-Mount Technology (SMT) of the present invention.
Figure 1B:
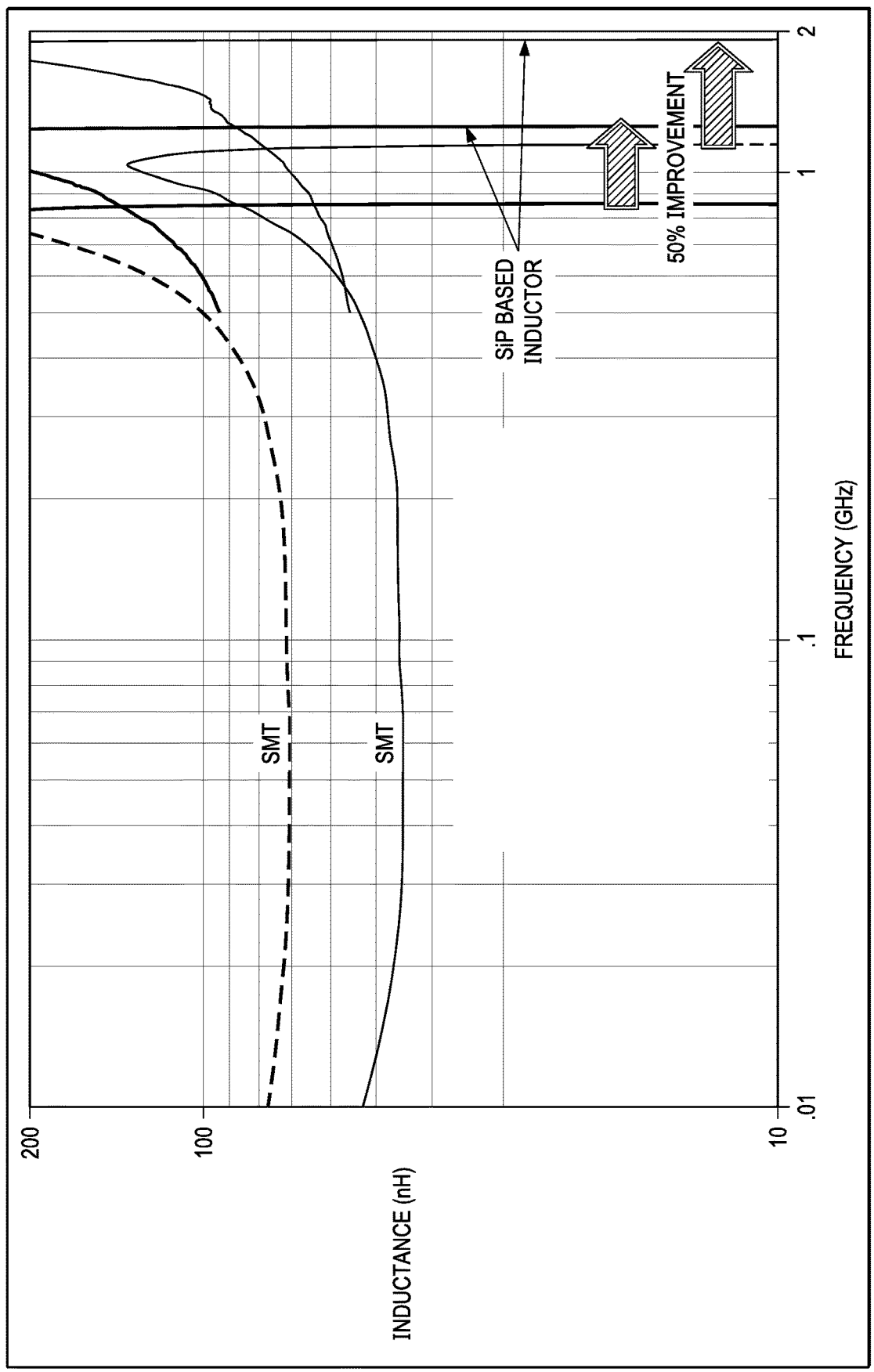
FIG. 1B is a graph that shows the impact of the parasitic signals/losses on the performance of a inductor in a SiP vs an SMT of the present invention.
Figure 2A:
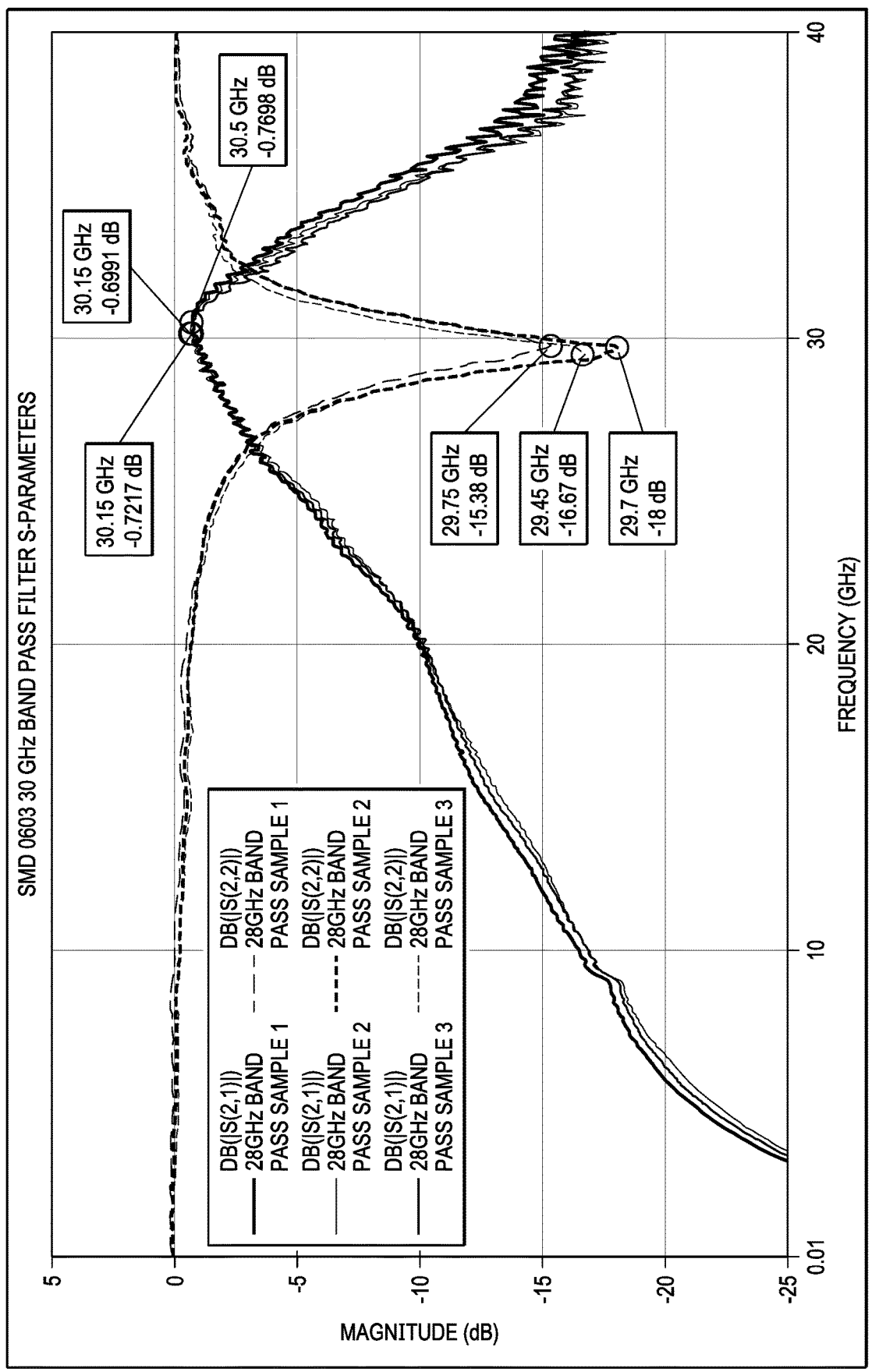
FIG. 2A is a graph that shows the performance of a 30 GHz Ban Pass filter and RF distortions in a Surface Mount Package on a PCB of the present invention.
Figure 2B:
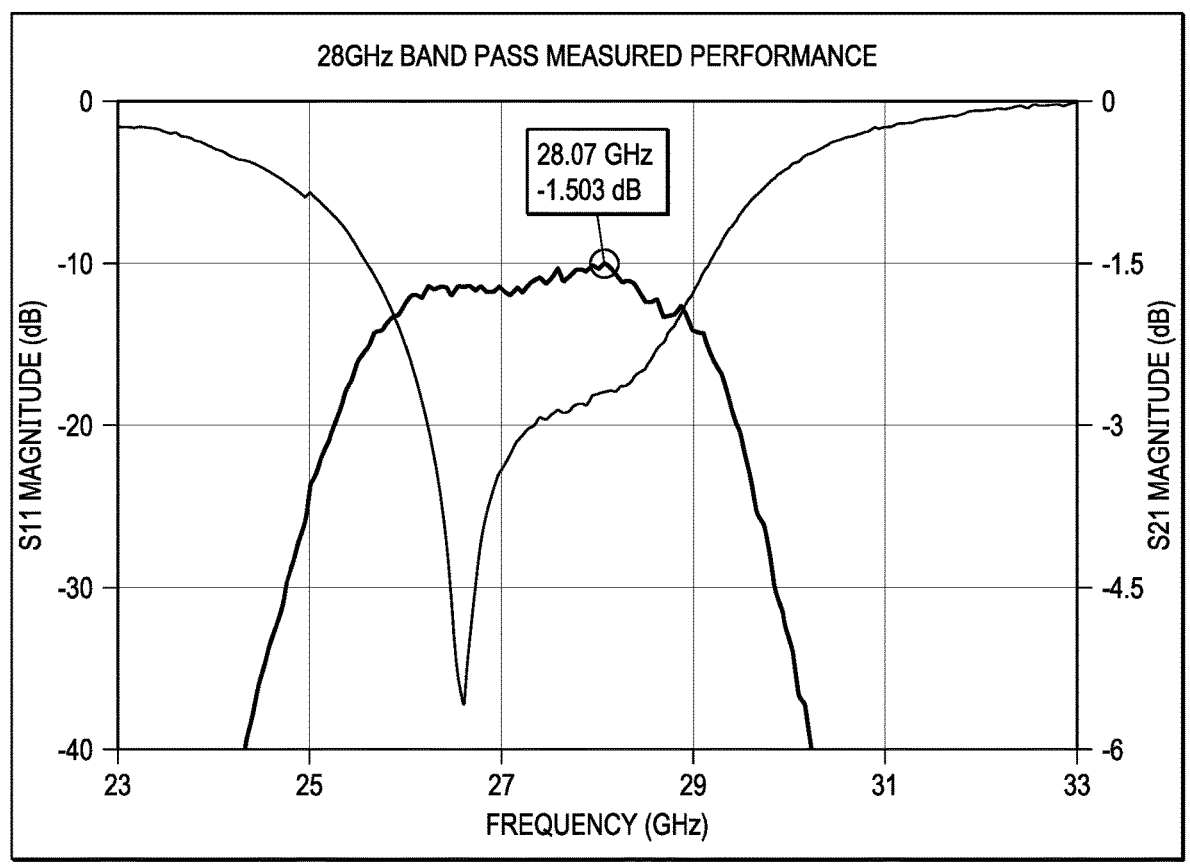
FIG. 2B is a graph that shows the performance of a 28 GHz SiP Ban Pass filter of the present invention.
Figure 2C:
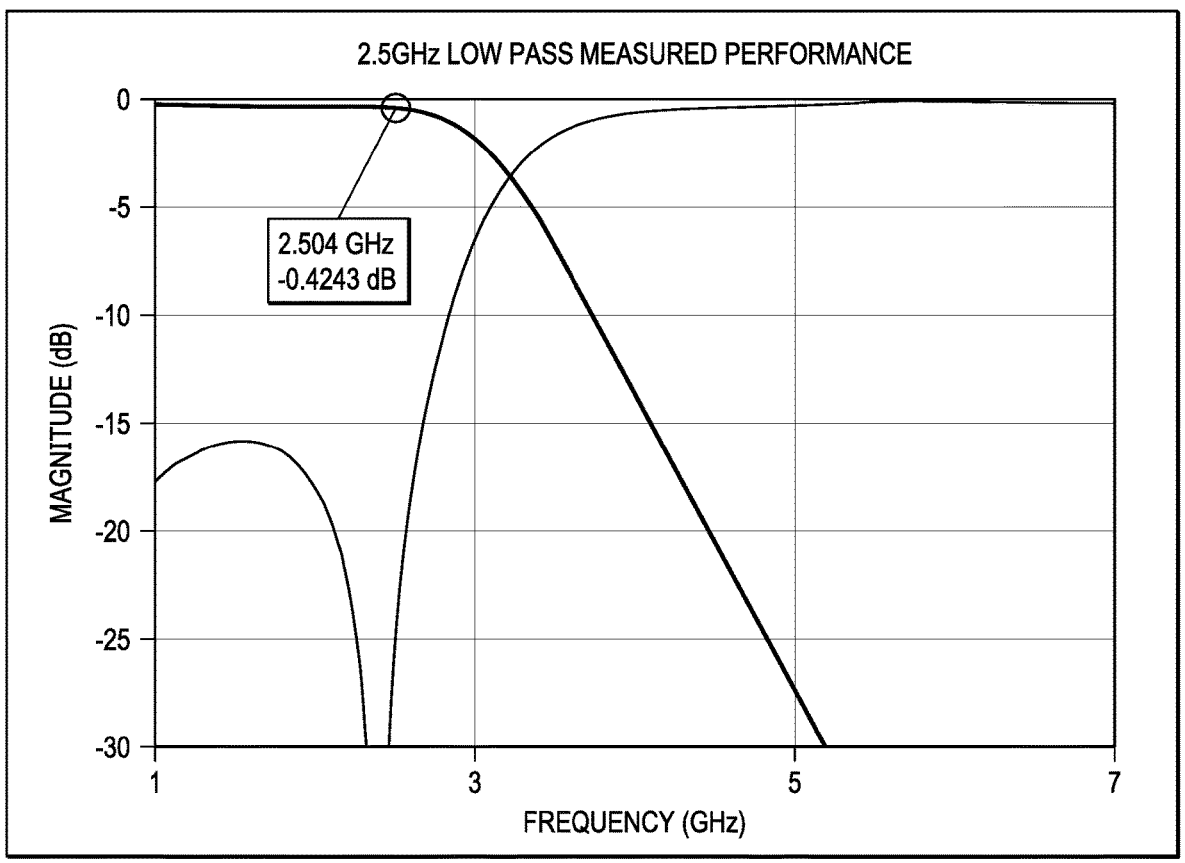
FIG. 2C is a graph that shows the performance of the SiP based 2.5 GHz Low Pass Filter of the present invention.
Figure 2D:
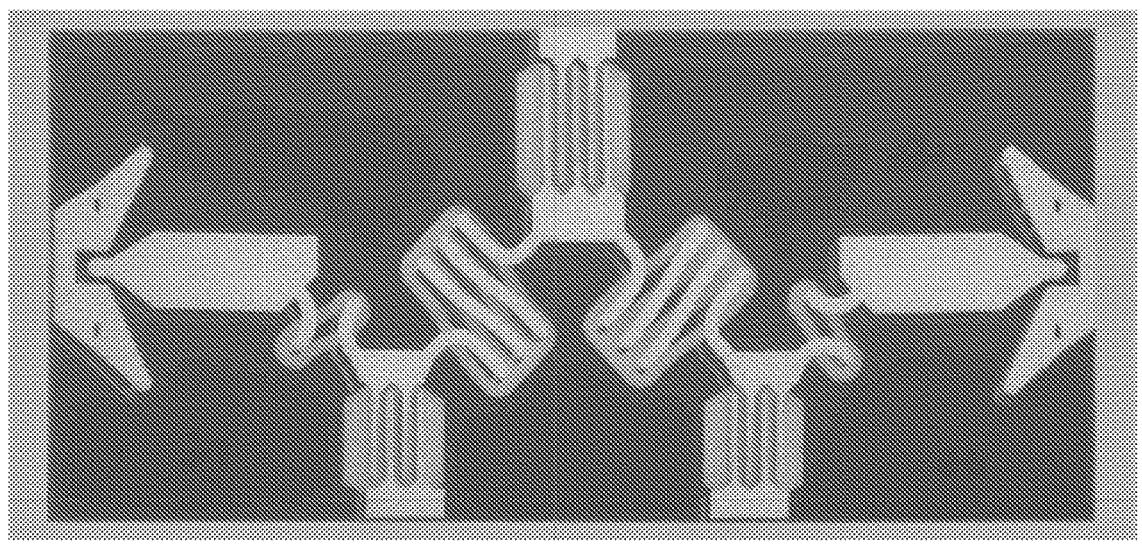
FIG. 2D is an image of the SiP based 2.5 GHz Low Pass Filter of the present invention.
Figure 3A:
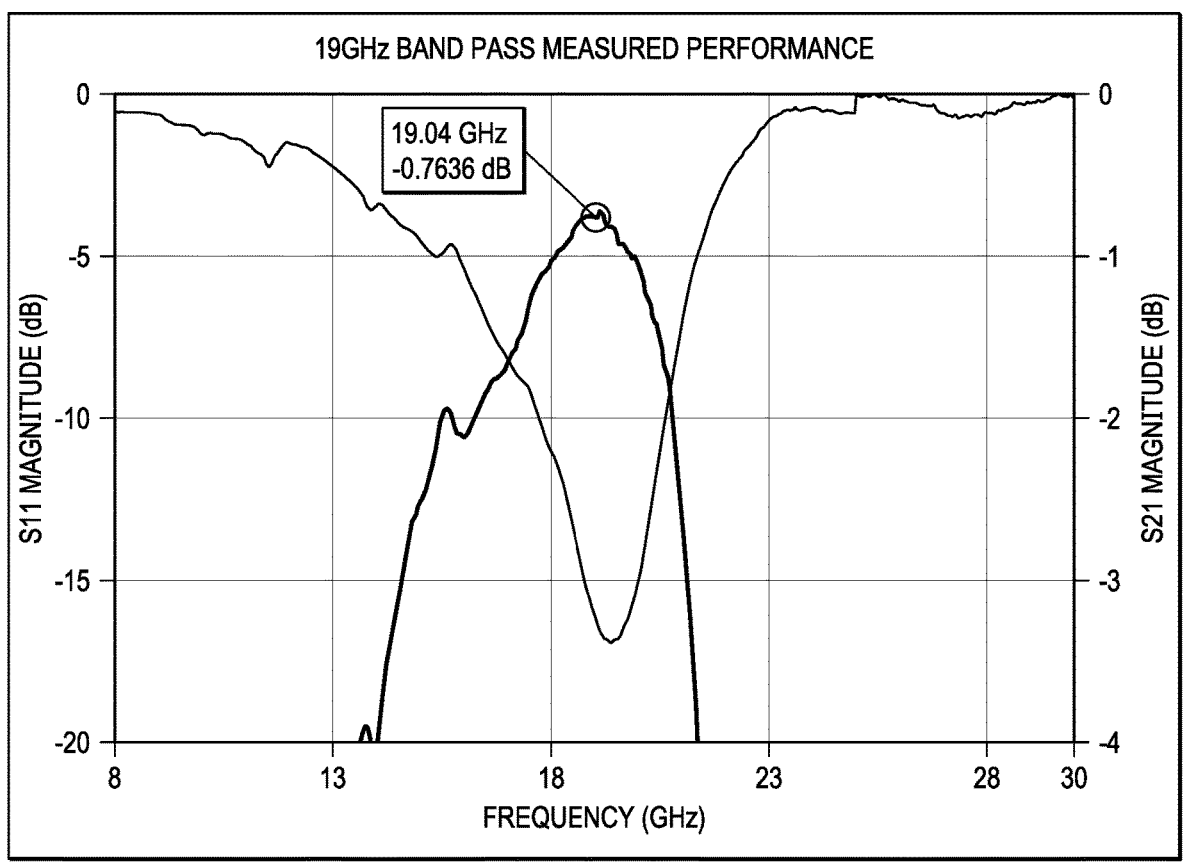
FIG. 3A is a graph that shows the performance of the SiP based 19 GHz Band Pass Filter of the present invention.
Figure 3B:
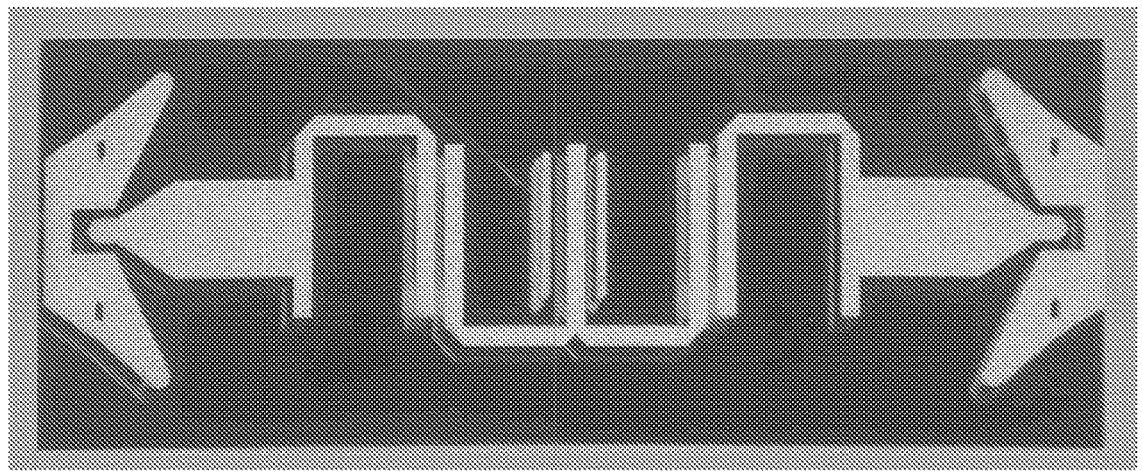
FIG. 3B is an image of the SiP based 19 GHz Band Pass Filter of the present invention.

FIG. 1A shows test results for the same 3 pF and 5 pF capacitors. One set of capacitors were integrated and tested on a glass SiP. The other set of capacitors were packaged in a Surface-Mount Technology (SMT) and tested. The resulting data showed SiP integrated capacitor had between 150% and 135% higher SRF compared to the same capacitors packaged SMT, thus significantly improving on the prior art. The improvement in the performance is due to the removal of losses from bonding pads, ball bond, embedded leads, substrate and other parasitic effects associated with the SMT packaging. FIG. 1B shows the performance between two inductors (56 nH and 95 nH) measured in either SMT or integrated SiP. SiP based Inductors have a 50% higher SRF than SMT parts due to the removal of parasitic losses or signals associated with capacitance generated by the pads of the SMT packaging. On average integrated SiP components have a 50% higher SRF compared to the exact same part as an SMT. As the performance differences between the integrated SiP devices relative to the SMT devices are measured in dB one can add the parasitic losses or signals associated with the use of a combination inductors and capacitors realized in filters, Doherty Amplifiers, circulators, isolators, antenna, power splitters, power combiners in addition to other RF/Microwave components used to make a system in a package. The combining of losses can be seen in FIGS. 2A to 2D. FIGS. 2A and 2B show the difference between lumped element filter's performance integrated into a SiP and the other packaged in a surface mount device (SMD) package. FIG. 1A shows the signal for a lumped element bandpass filter in the SMD package mounted on a printed circuit board based SiP. FIG. 1B shows the signal for the same lumped element bandpass filter integrated directly into the glass based SiP. The normalized difference between the areas under performance curves of FIGS. 1A and 1B is approximately 200%. This show that the use of RF lumped element device integrated directly into the SiP substrate reduces or eliminates the parasitic noise and losses by up to 200%. Eliminating the losses, distortion/noise, parasitic signals and poor performance quality factor. The SiP based lumped element devices can have capacitors with quality factors much greater than 80 with inductors with quality factors much greater than 120. The enhanced performance of lumped element devices that are integrated directly into the SiP have demonstrated dramatically improved functionality in RF/Microwave device that can now be coupled with small feature size. The directly integrated lumped element based devices into or on to the SiP include but are not limited to: RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, and/or Diplexors. These directly integrated lumped element devices on the SiP are connected with integrated circuits devices. These integrated circuits devices including but not limited to: microprocessors, multiplexers, switches, amplifiers, and memories. FIG. 3A is a graph that shows the performance of the SiP based 19 GHz Band Pass Filter of the present invention. FIG. 3B is an image of the SiP based 19 GHz Band Pass Filter of the present invention.

Figure 4A:
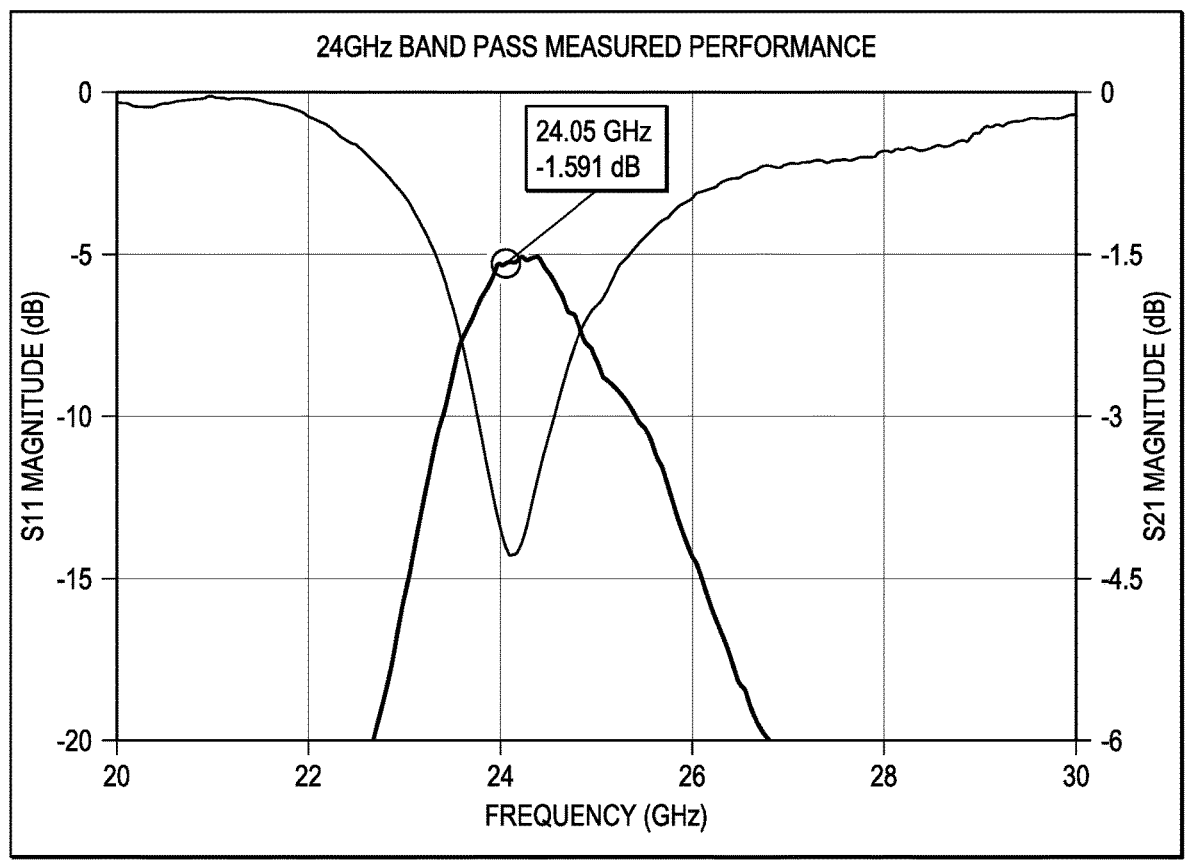
FIG. 4A is a graph that shows the performance of the SiP based 24 GHz Band Pass Filter of the present invention.
Figure 4B:
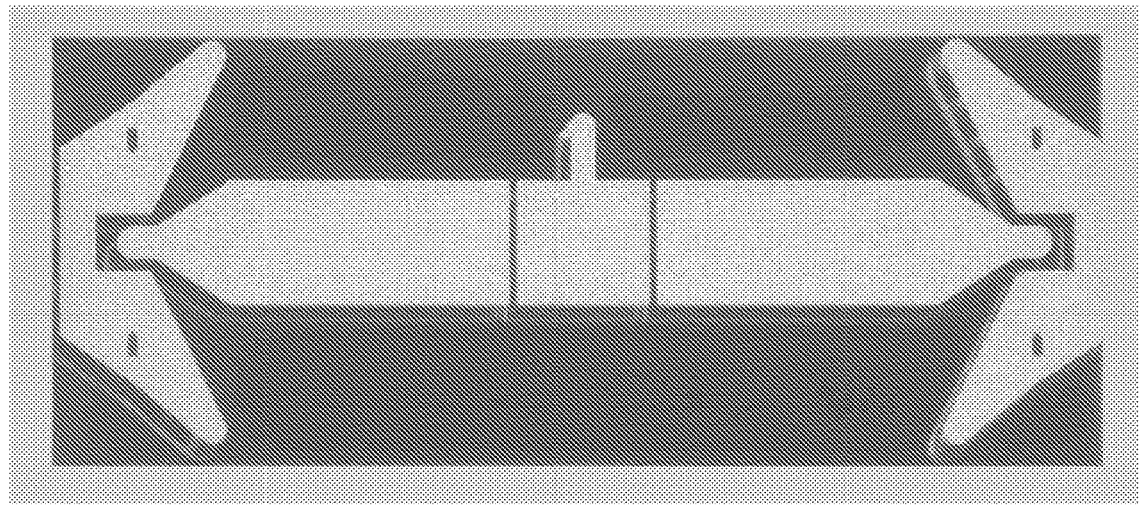
FIG. 4B is an image of the SiP based 24 GHz Band Pass Filter of the present invention.

FIG. 4A is a graph that shows the performance of the SiP based 24 GHz Band Pass Filter of the present invention. The present invention improved the signal by 150% and 135% for the SiP of the present invention versus SMT when measuring capacitance versus frequency. FIG. 4B is a graph that shows the performance of the SiP based 24 GHz Band Pass Filter. The present invention improved the signal by 50% using the SiP of the present invention when compared to SMT when measuring inductance versus frequency.

Figure 5A:
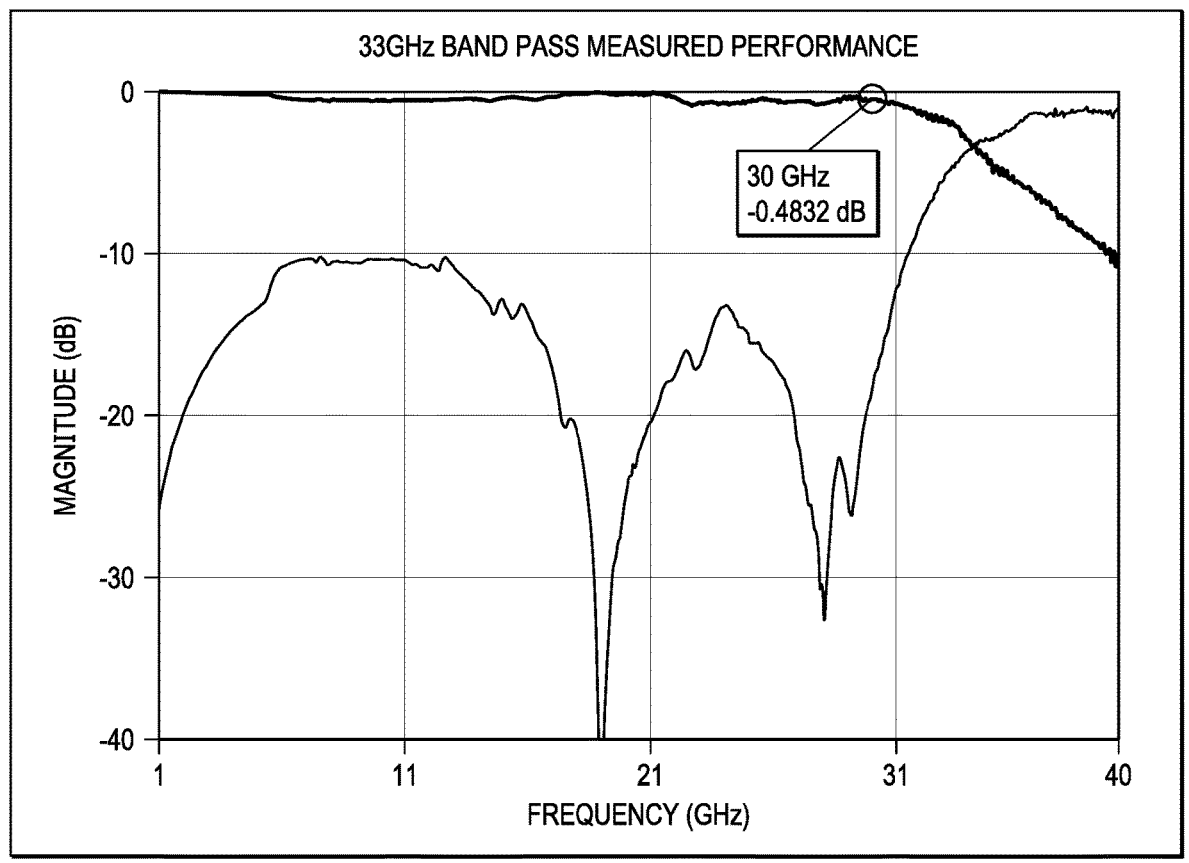
FIG. 5A is a graph that shows the performance of the SiP based 33 GHz Low Pass Filter of the present invention.
Figure 5B:
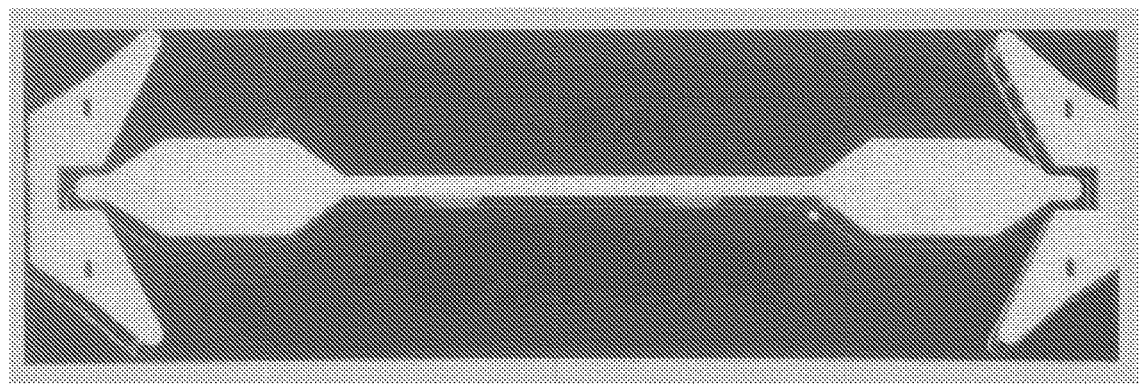
FIG. 5B shows the image of the SiP based 33 GHz Low Pass Filter of the present invention.

FIG. 5A is a graph that shows the performance of the SiP based 33 GHz Low Pass Filter of the present invention. FIG. 5B shows the image of the SiP based 33 GHz Low Pass Filter of the present invention.

Figure 6A:
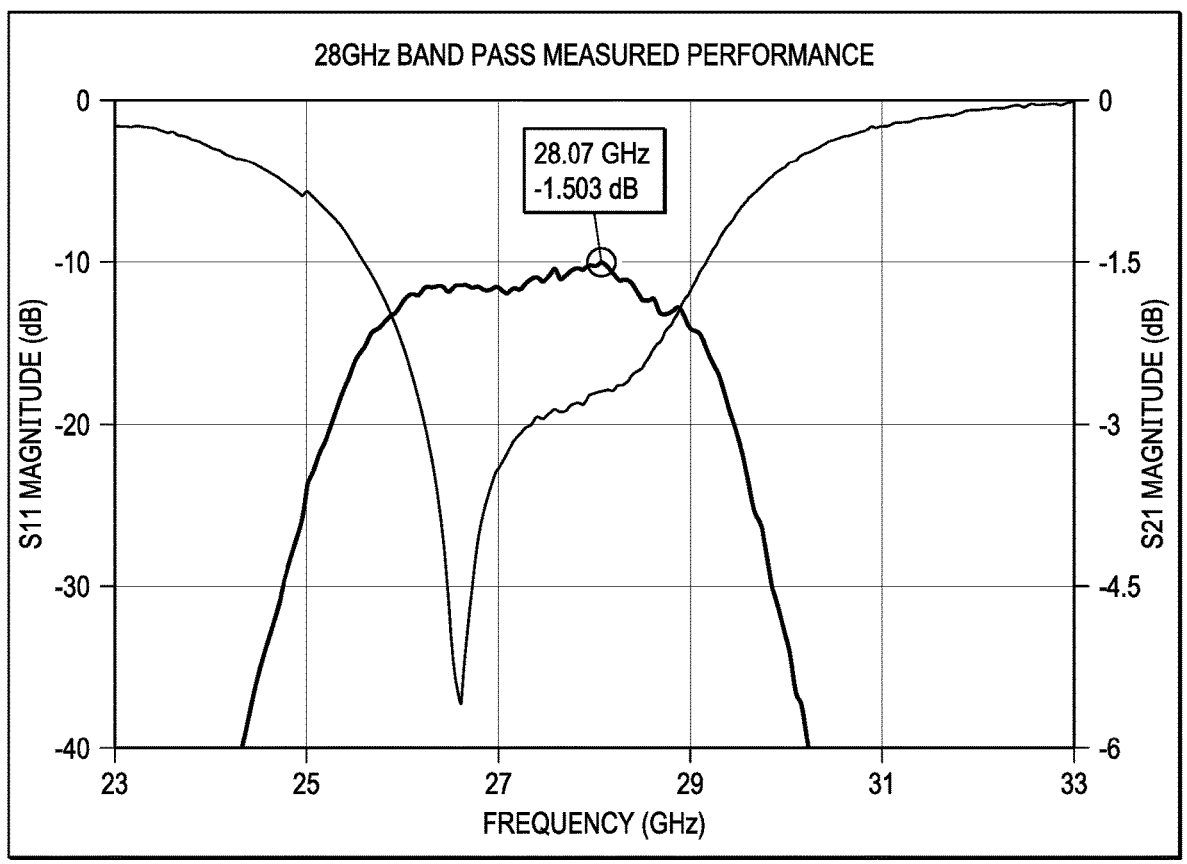
FIG. 6A is a graph that shows the performance of the SiP based 28 GHz Band Pass Filter of the present invention.
Figure 6B:
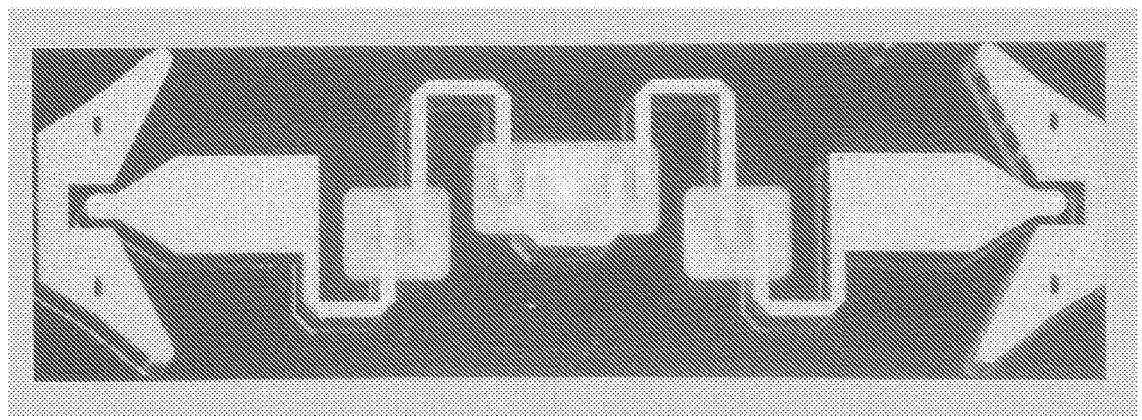
FIG. 6B shows the image of the SiP based 28 GHz Band Pass Filter of the present invention.

FIG. 6A is a graph that shows the performance of the SiP based 28 GHz Band Pass Filter of the present invention. FIG. 6B shows the image of the SiP based 28 GHz Band Pass Filter of the present invention.

Figure 7A:
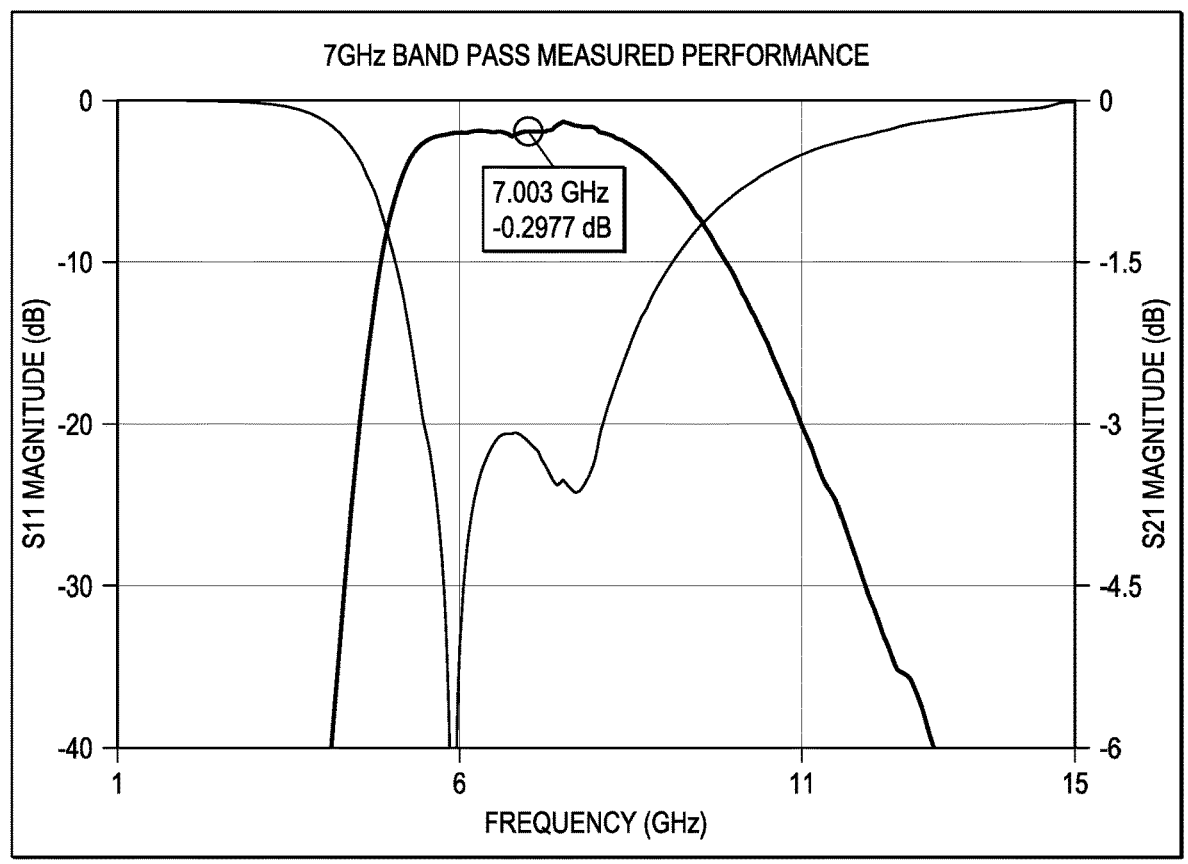
FIG. 7A is a graph that shows the performance of the SiP based 7 GHz Band Pass Filter of the present invention.
Figure 7B:
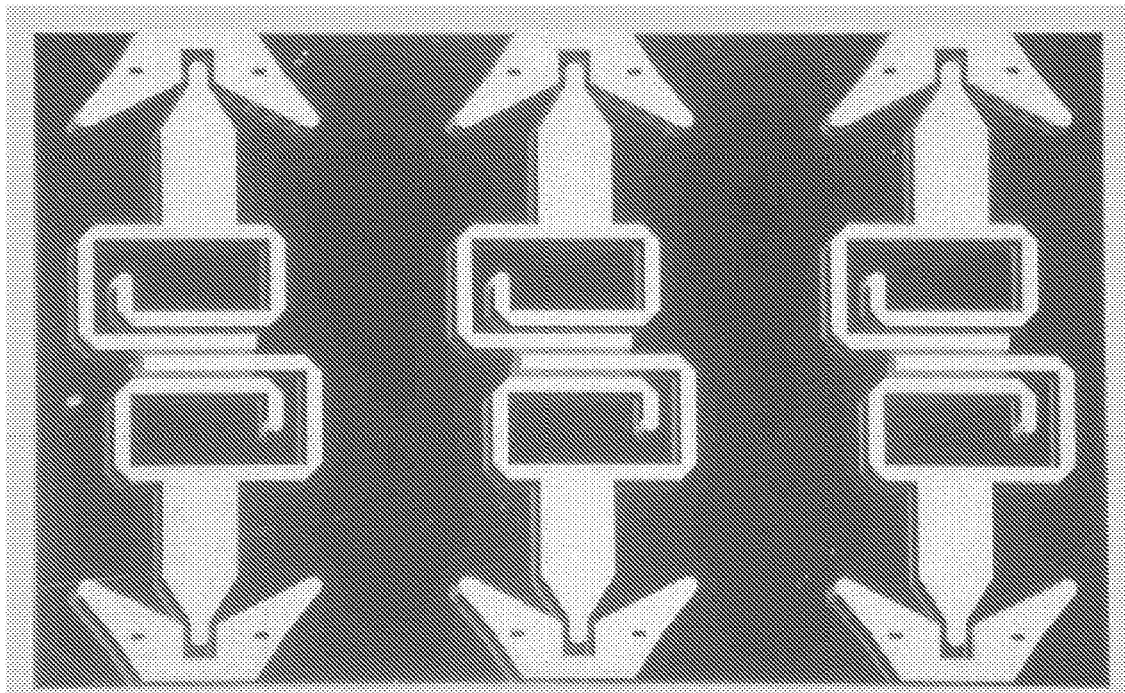
FIG. 7B shows the image of several SiP based 7 GHz Band Pass Filter of the present invention.

FIG. 7A is a graph that shows the performance of the SiP based 7 GHz Band Pass Filter of the present invention. FIG. 7B shows the image of several SiP based 7 GHz Band Pass Filter of the present invention.

Figure 8:
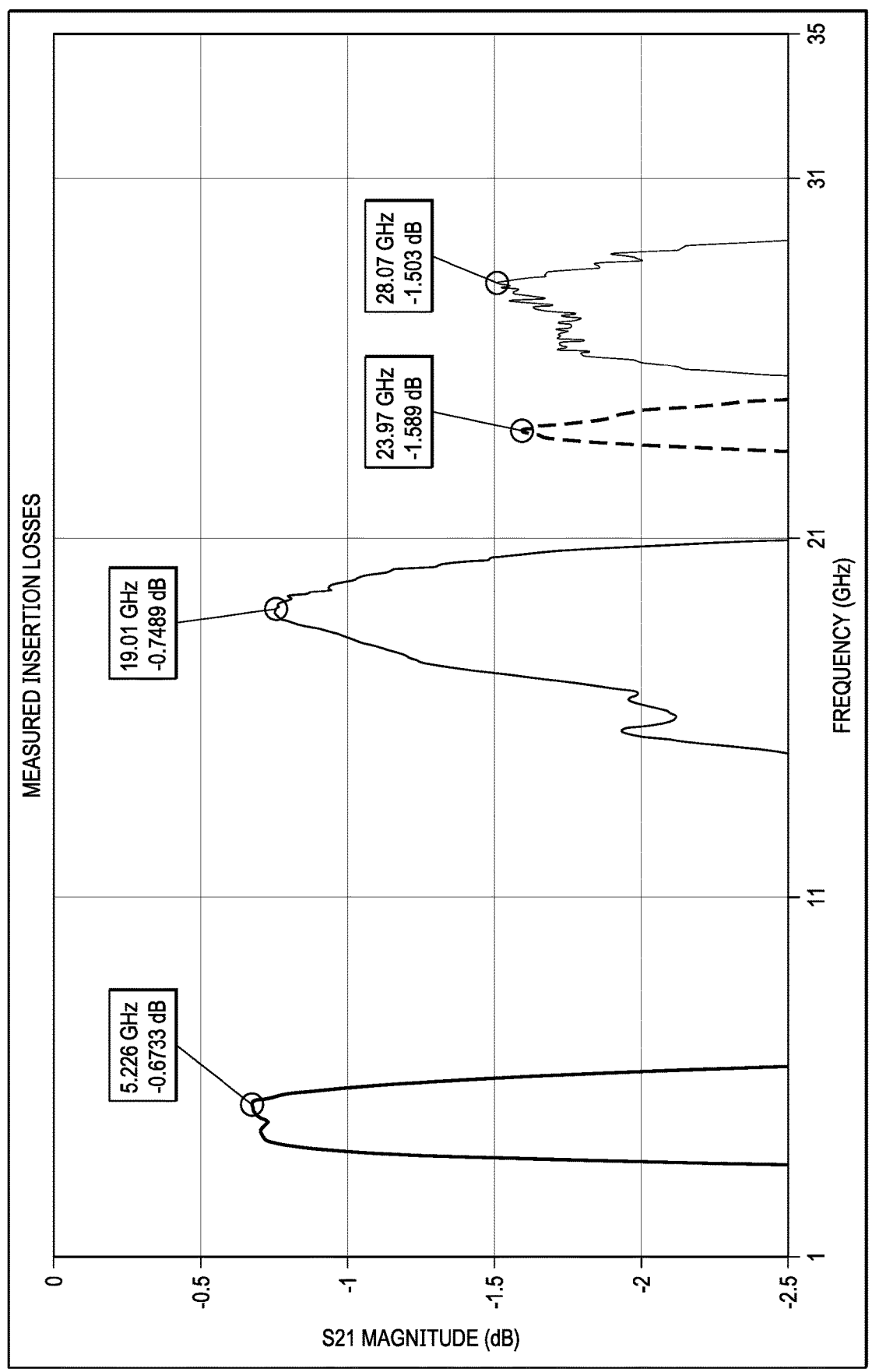
FIG. 8 is a graph that shows the insertion loss of SiP based Filters of the present invention.

FIG. 8 is a graph that shows the insertion loss of SiP based Filters of the present invention.

Figure 9:
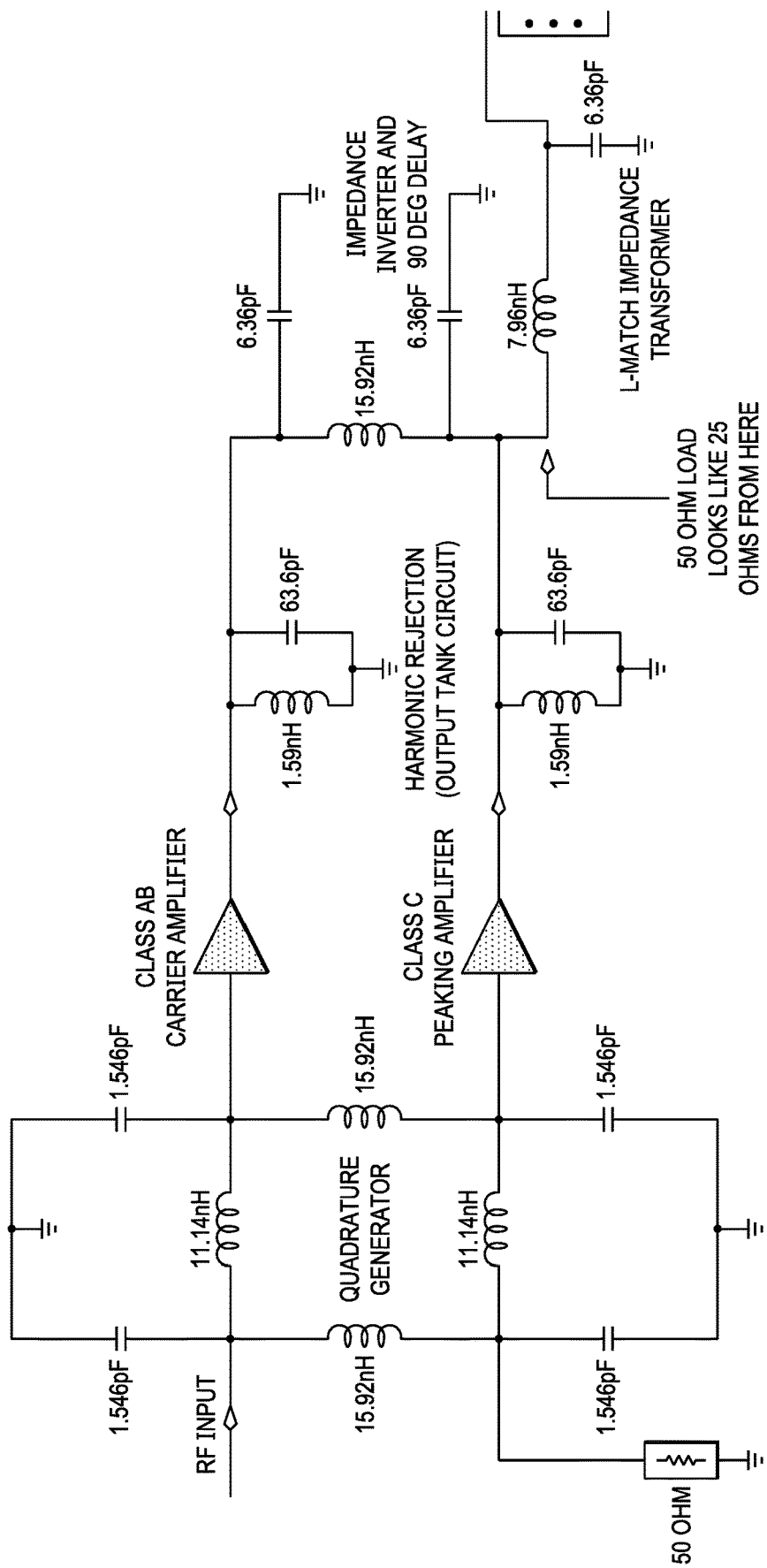
FIG. 9 shows a Doherty Amplifier design including the lumped elements of the present invention.
Figure 10:
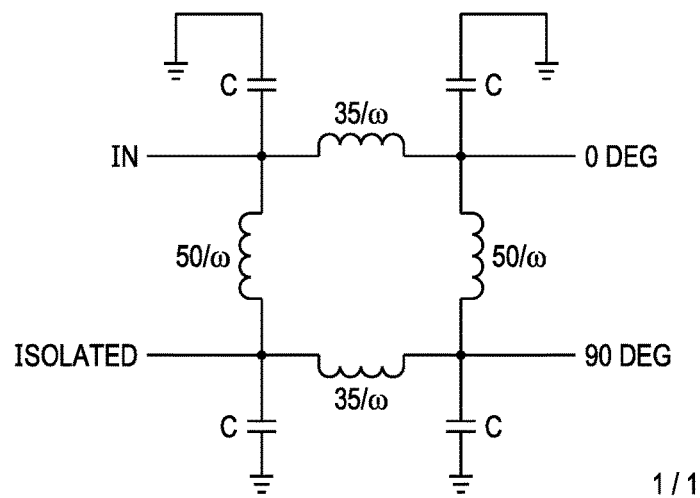
FIG. 10 shows a power divider/combiner.
Figure 11:
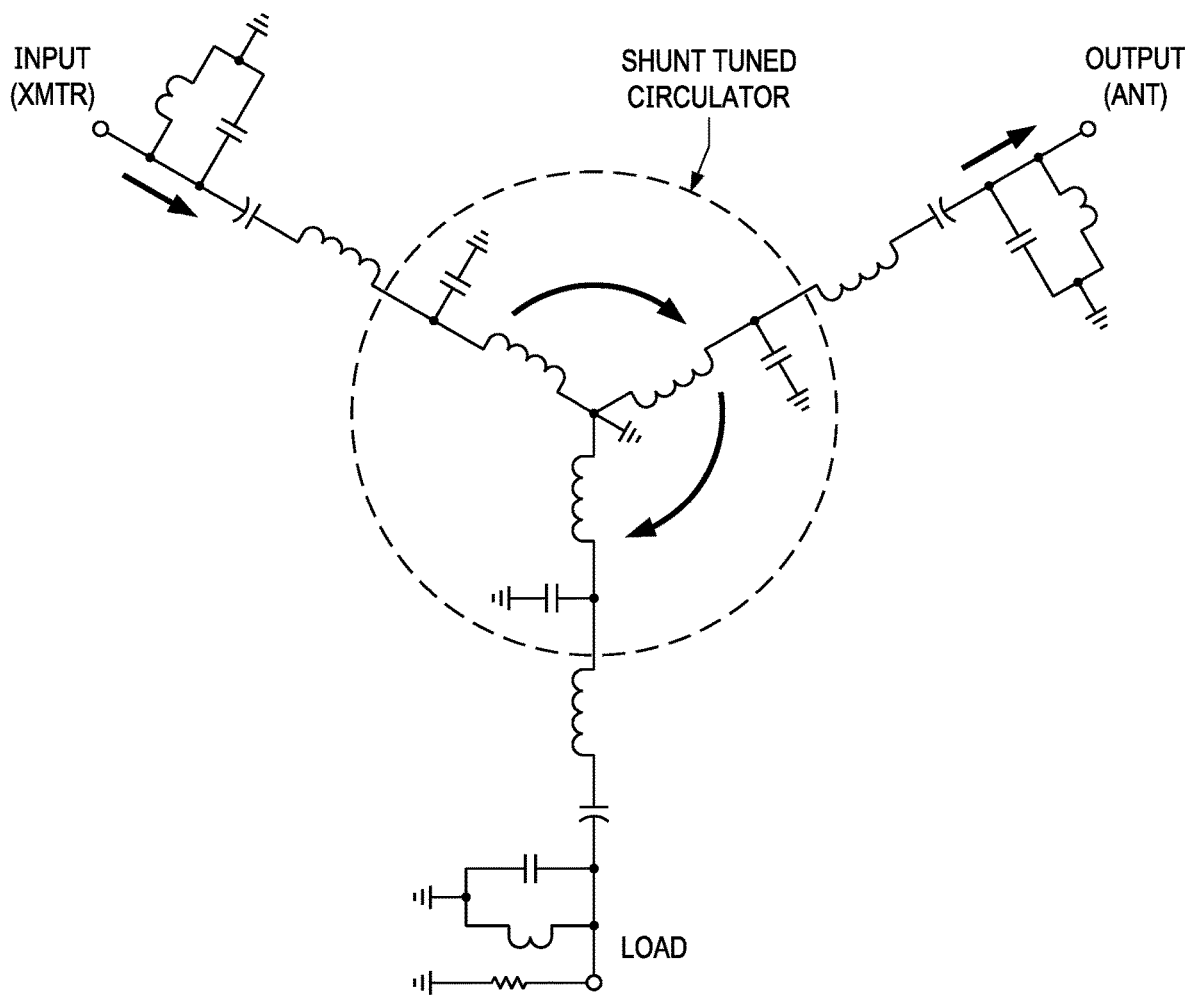
FIG. 11 shows a lumped element circulator when a termination resistor is connected to the circulator, it becomes an isolator.
Figure 12:
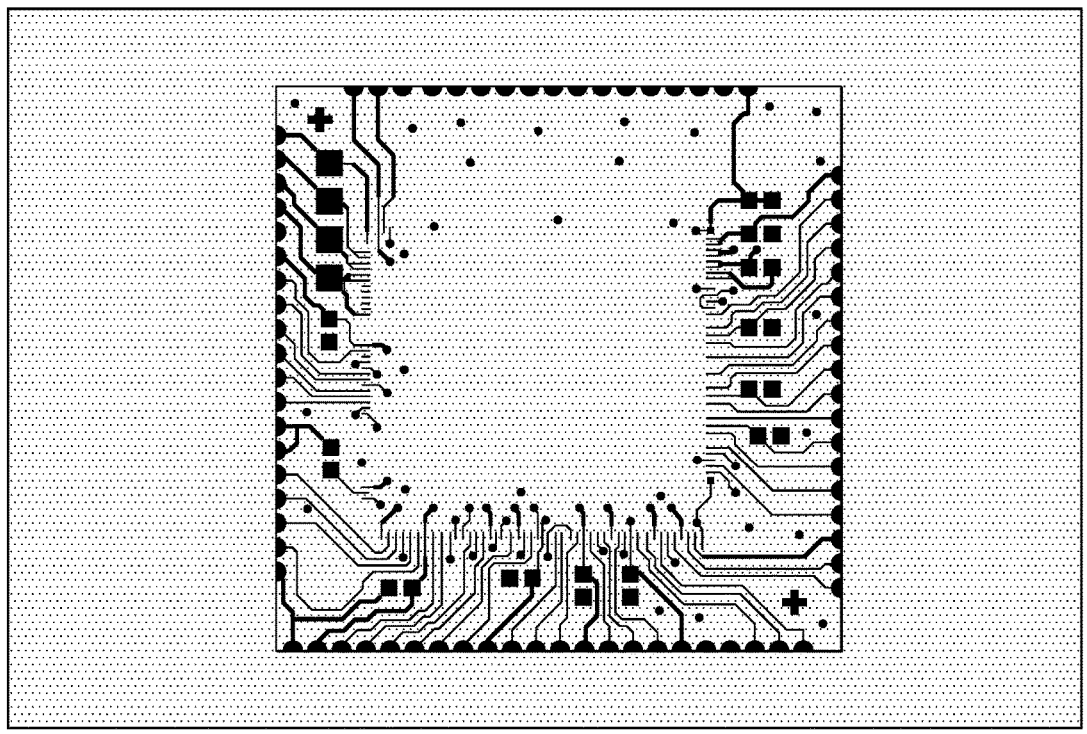
FIG. 12 shows glass based SiP with integrated lumped element devices of the present invention.

FIG. 9 shows a Doherty Amplifier design including the lumped elements that can be made using the present invention. FIG. 10 shows a power divider/combiner that can be made using the present invention. FIG. 11 shows a lumped element circulator when a termination resistor is connected to the circulator, it becomes an isolator and can be made using the present invention. FIG. 12 shows glass based SiP with integrated lumped element devices of the present invention. The SiP is approximately 0.5 cm×0.5 cm. FIG. 13 shows a sampling of glass based SiP with integrated lumped element devices of the present invention. Depending of size of the SiP there can be a great number of SiPs on a single wafer.

In particular a SiP with a integrated lump element RF device has been produced with design to device parity in APEX® Glass using conventional semiconductor processing equipment. The integrated lumped element RF filter in the APEX® Glass SiP can be seen in FIG. 12. The APEX® Glass SiP with the integrated lump element devices. The open area in the center of the SiP is for the placement of integrated circuits to complete the SiP. FIG. 13 shows a sampling of glass based SiP with integrated lumped element devices of the present invention. Depending of size of the SiP there can be a great number of SiPs on a single wafer. The APEX™ Glass wafer populated with over 500 SiP with the integrated lump element devices.

An SiP with a fully integrated lumped element device can be produced in a photo-definable glasses have high temperature stability, good mechanical and electrical properties, and have better chemical resistance than plastics and many metals. To our knowledge, the only commercial photo-definable glass is FOTURAN™, made by Schott Corporation. FOTURAN™ comprises a lithium-aluminum-silicate glass containing traces of silver ions. When exposed to UV-light within the absorption band of cerium oxide the cerium oxide acts as sensitizers, absorbing a photon and loosing an electron that reduces neighboring silver oxide to form silver atoms, e.g.,

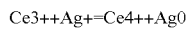

$Ce^{3+}+Ag^{+}=Ce^{4+}+Ag^{0}$

The silver atoms coalesce into silver nanoclusters during the baking process and induces nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air for FOTURAN™). The crystalline phase is more soluble in etchants, such as hydrofluoric acid (HF), than the unexposed vitreous, amorphous regions. In particular, the crystalline regions of FOTURAN™ are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photoetchable glass," Microelectronic Engineering 30, 497 (1996), which is incorporated herein by reference.

Preferably, the shaped glass structure contains at least one or more, two or three-dimensional inductive device. The inductive device is formed by making a series of connected loops to form a free-standing inductor. The loops can be either rectangular, circular elliptical, fractal or other shapes that create and pattern that generates induction. The patterned regions of the APEX® glass can be filled with metal, alloys, composites, glass or other magnetic media, by a number of methods including plating or vapor phase deposition. The magnetic permittivity of the media combined with the dimensions and number of structures (loops, turns or other inductive element) in the device provide the inductance of devices.

FOTURAN™ is described in information supplied by Invenios (the U.S. supplier for FOTURAN™) is composed of silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight. As used herein the terms "APEX® Glass ceramic", "APEX glass" or simply "APEX" is used to denote one embodiment of the glass ceramic composition of the present invention.

The present invention provides a single material approach for the fabrication of optical microstructures with photo-definable APEX glass for use in imaging applications by the shaped APEX glass structures that are used for lenses and includes through-layer or in-layer designs.

Generally, glass ceramics materials have had limited success in microstructure formation plagued by performance, uniformity, usability by others and availability issues. Past glass-ceramic materials have yield etch aspect-ratio of approximately 15:1 in contrast APEX® glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX® Glass ceramic this conversion is closer to 70%.

The APEX® Glass composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

The present invention includes a method for fabricating a glass ceramic structure for use in forming inductive structures used in electromagnetic transmission, transformers and filtering applications. The present invention includes an inductive structures created in the multiple planes of a glass-ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible to create in most glass, ceramic or silicon substrates. The present invention has created the capability to create such structures in both the vertical as well as horizontal plane for glass-ceramic substrates. The present invention includes a method for fabricating of a inductive structure on or in a glass ceramic.

Ceramicization of the glass is accomplished by exposing the entire glass substrate to approximately 20 J/cm² of 310 nm light. When trying to create glass spaces within the ceramic, users expose all of the material, except where the glass is to remain glass. In one embodiment, the present invention provides a quartz/chrome mask containing a variety of concentric circles with different diameters.

The present invention includes a method for fabricating an inductive device in or on glass ceramic structure electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This and other varied composition are generally referred to as the APEX® glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to create an inductive structure. The mask for the exposure can be of a halftone mask that provides a continuous grey scale to the exposure to form a curved structure for the creation an inductive structure/ device. A halftone mask or grey scale enables the control the device structure by controlling the exposure intensity undercut of A digital mask can also be used with the flood exposure can be used to produce for the creation an inductive structure/device. The exposed glass is then typically baked in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch.

The glass substrate is then etched in an etchant, of HF solution, typically 5% to 10% by volume. The fully integrated lumped element device(s) structure are created creating by:

Although the present invention and its advantages have been described in detail, it should be understood that various changes, substitutions and alterations can be made herein without departing from the spirit and scope of the invention as defined by the appended claims. In some cases where the desired circuit performance or material compatibility the SiP may choose to use a SMD version of a resistor, capacitor, or inductor, in lieu of one of the photo-definable glass based devices. Using an SMD version of one or more of the elements will contribute to the parasitic generated noise of the SiP requiring extra care in the assembly and packaging. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Figure 14A:
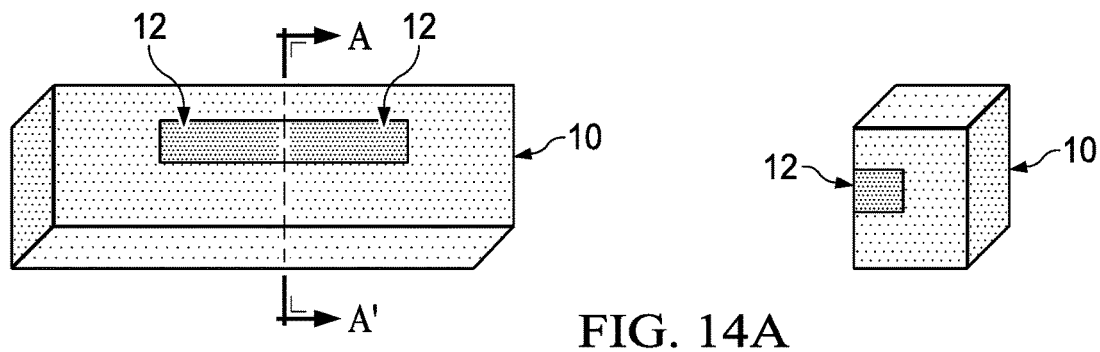

FIGS. 14A-14F show the process of making a device using the present invention. FIGS. 14A to 14D show one example of the present invention. FIG. 14A shows the starting material that is a photodefinable glass 10, which can be a wafer and may preferably be an APEX® Glass of, e.g., a 1 mm thickness with a surface roughness less than or equal to 50 nm and surface to surface parallel less than or equal to 10% with an RMS roughness <200Å. In each of FIGS. 14A to 14D a top, isometric view is shown with a cross-sectional side view shown along dotted line A-A'. In this example, a resistor section of SiP and its manufacture is shown. On a surface of the photodefinable glass wafer from Step 1, a photomask is deposited on the photodefinable glass 10 with the pattern of a trench/rectangle is formed, and the photodefinable glass 10 is exposed to a radiation at 310 nm with an intensity ~20 J/cm2 and baked to create the exposure as described above. The width, length and depth of the exposure combined with the resistivity of the resistor media, which determines the resistor value. Both a top view of a cross-sectional side view are shown including a via pattern for the resistor is shown. Exposure of the photodefinable glass 10 not covered by the mask creates a ceramic 12 in the photodefinable glass 10.

Figure 14B:
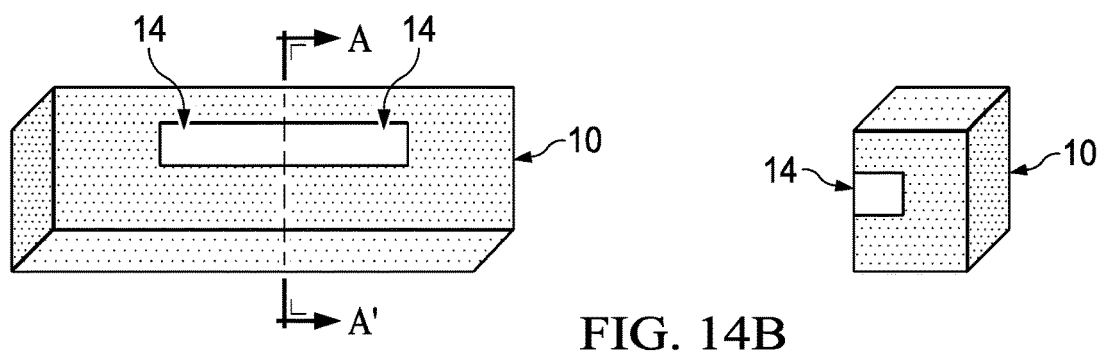

In FIG. 14B, the ceramic 12 that was formed in the prior step is further processed. The photodefinable glass 10 regions that have been converted to ceramic 12 are etched in a wet etch of HF acid as described above to form a trench 14.

Figure 14C:
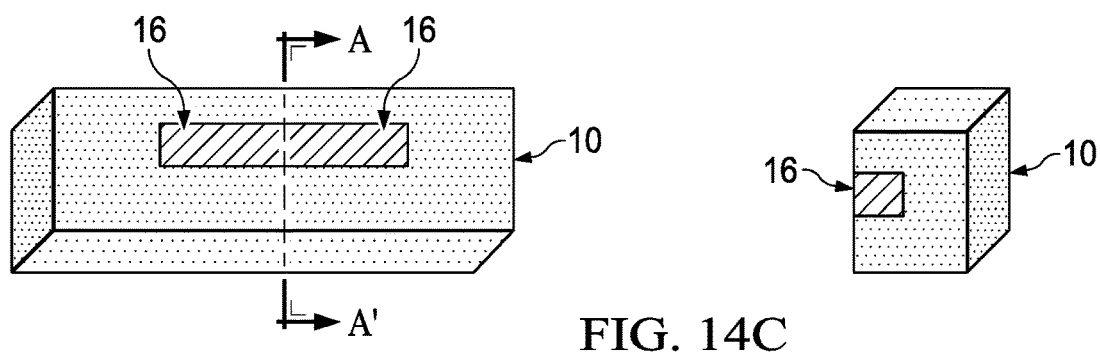
Figure 14D:
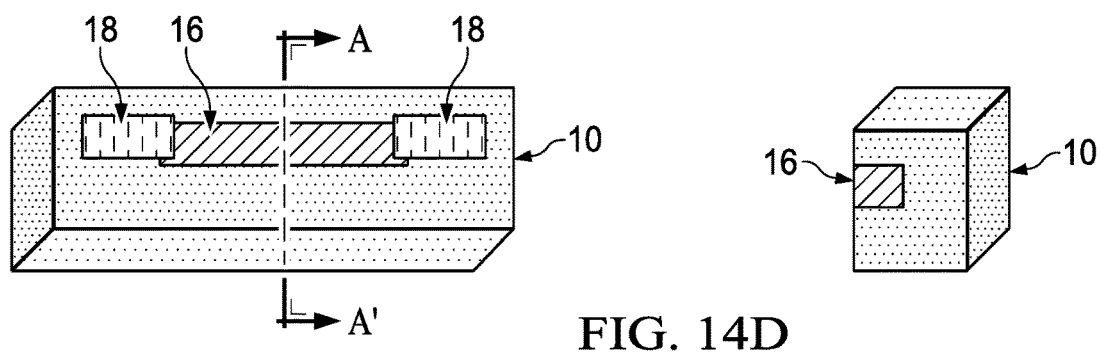

In FIG. 14C, the etched regions of the photodefinable glass 10 are filled with a RF resistor paste or media 16 of Alumina, AlN, Be or other high frequency resistor material. The trench 14 is filed resistor paste or media 16 is deposited via a silk screening process. Excess paste is removed by a light DI water or IPA rinse and nylon wipe.

The photodefinable glass 10 wafer with the resistor paste 16 is then placed into an annealing oven with an inert environment such as Argon or a vacuum. The photodefinable glass 10 wafer is ramped to sinter the resistive material. Any excess resistor media on the surface can be removed by a 5 min CMP process with 2 μm Silica polishing media and water.

To connect the resistor, the photodefinable glass 10 is again coated with a standard photoresist. A pattern is exposed and developed following the standard process to create a pattern through the photoresists that a resistor layer can be deposited. The wafer is exposed to a light O2 plasma to remove any residual organic material in the pattern. Typically this is accomplished at 0.1 mTorr with 200 W forward power for 1 min. Next, a metallization layer 18 is deposited, e.g., a thin film of tantalum, titanium TiN, TiW, NiCr or other similar media. Typically, the deposition is accomplished by a vacuum deposition. The vacuum deposition of a seed layer can be accomplished by DC sputtering of tantalum through a liftoff pattern on to the glass substrate at a rate of 40 Å/min.

In another method, the photodefinable glass 10 wafer is coated with a standard photoresist. A pattern is exposed and developed following the standard process to create a pattern through the photoresists that a metallic seed layer can be deposited. The wafer is exposed to a light O2 plasma to remove any residual organic material in the pattern. Typically this is accomplished at 0.1 mTorr with 200 W forward power for 1 min. A thin film seed layer of 400 Å of tantalum is deposited by a vacuum deposition. The vacuum deposition of a seed layer can be accomplished by DC sputtering of tantalum through a liftoff pattern on to the glass substrate at a rate of 40 Å/min.

Figure 14E:
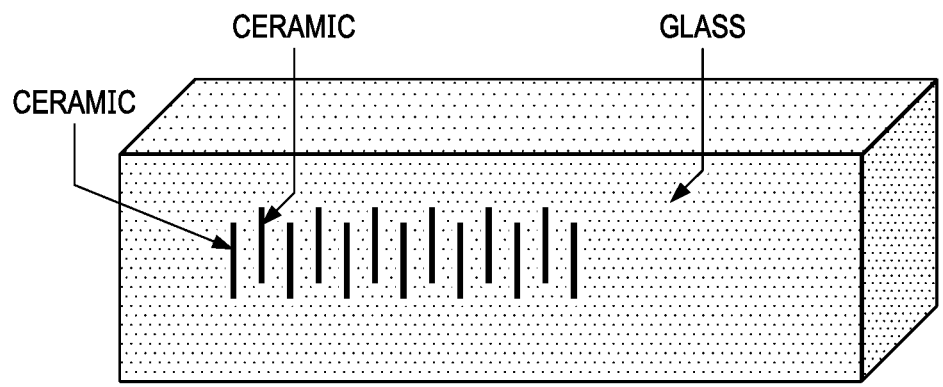

In another embodiment, shown in FIG. 14E, a capacitor section of SiP is formed using masks. On the surface of the photodefinable glass 10 wafer from Step 1, a photomask is used to image the capacitor at 310 nm light with an intensity of ~20 J/cm2 to create a ladder shaped exposure in the photodefinable glass as described above. The spacing between the runs in the ladder can range between 5% to 95%. This structure forms an interdigitated electrode based capacitor.

Figure 14F:
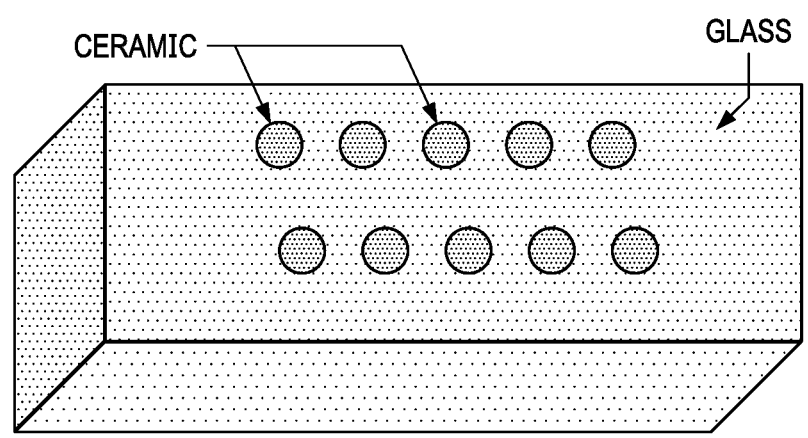

In another embodiment, shown in FIG. 14F, an inductor section of SiP is formed using masks. On a surface adjacent to the capacitor or resistor on the photodefinable glass 10 wafer as described hereinabove, a photomask with the pattern of through-hole vias is made where one of the rows of via are offset by 30% to the other row. The via pattern is exposed at 310 nm radiation at an intensity of ~20 J/cm2 to create the exposure as described above. This figures shows a top view of via pattern for the inductor.

The glass regions that have been converted to ceramic are etched in a wet etch of HF acid as described above. The photodefinable glass 10 wafer is the placed in a copper plating bath that preferentially plates the etched ceramic structure and completely fills the via and interdigitated line structure as described above.

Figure 15A:
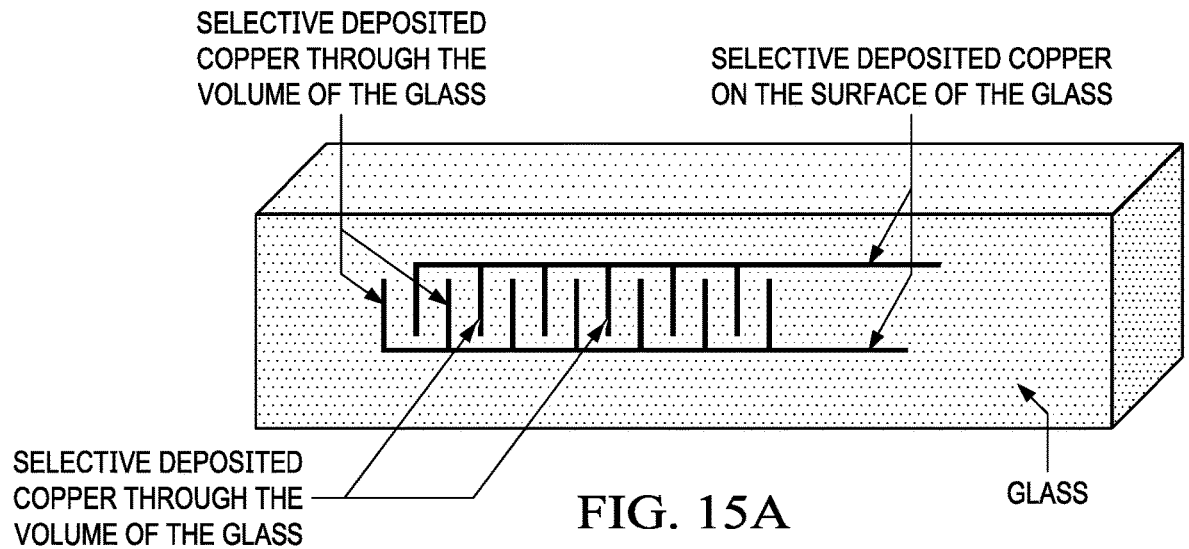
Figure 15B:
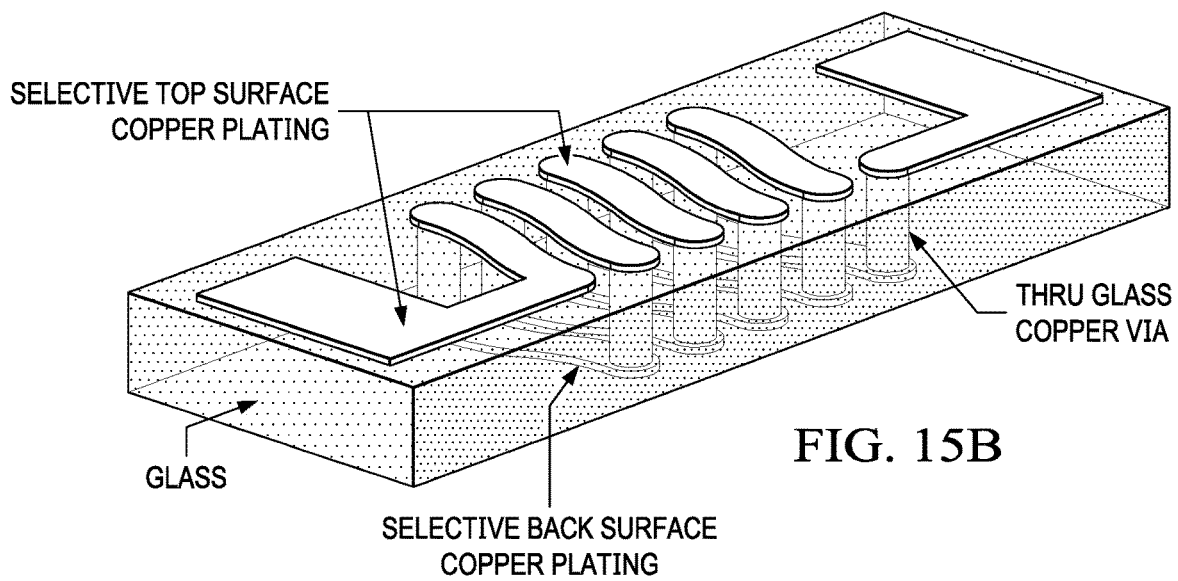
Figure 15C:
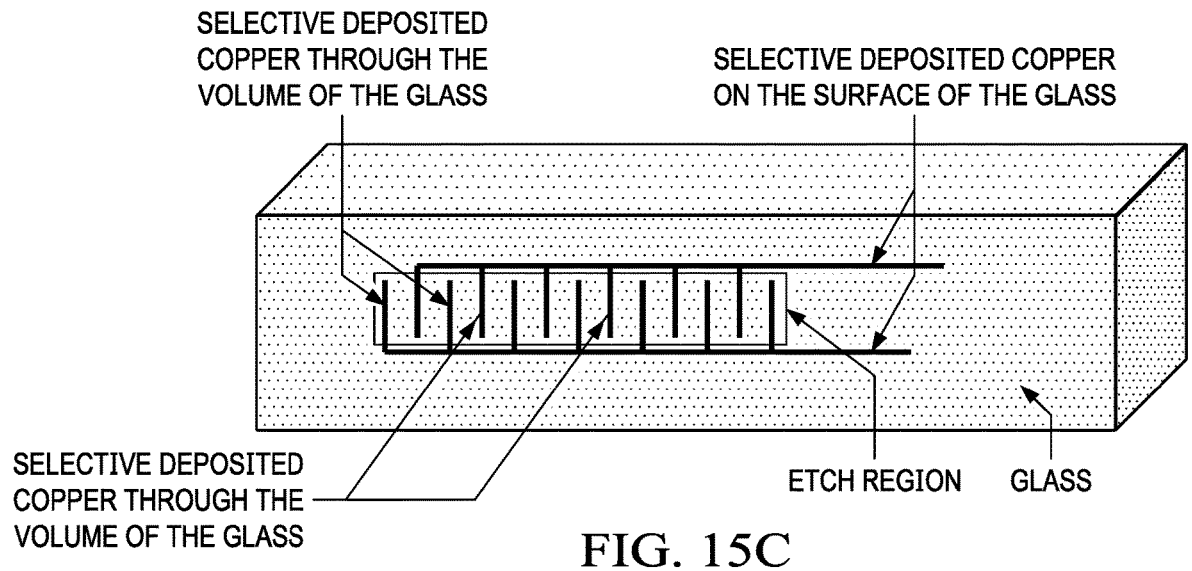
Figure 15D:
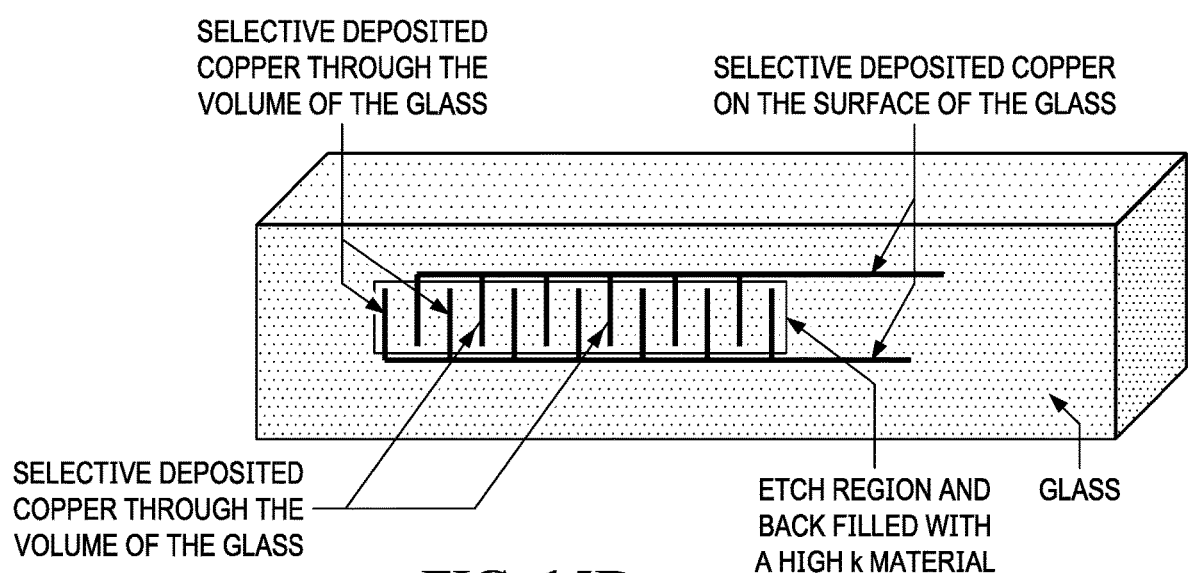
Figure 15E:
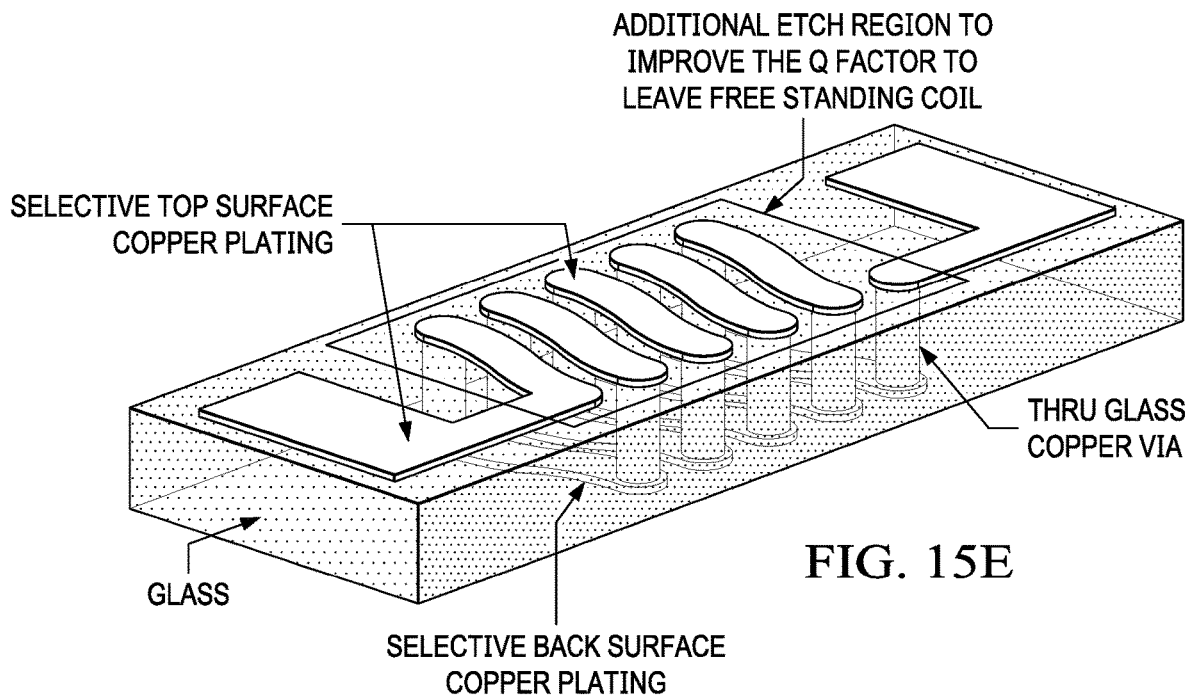
Figure 15F:
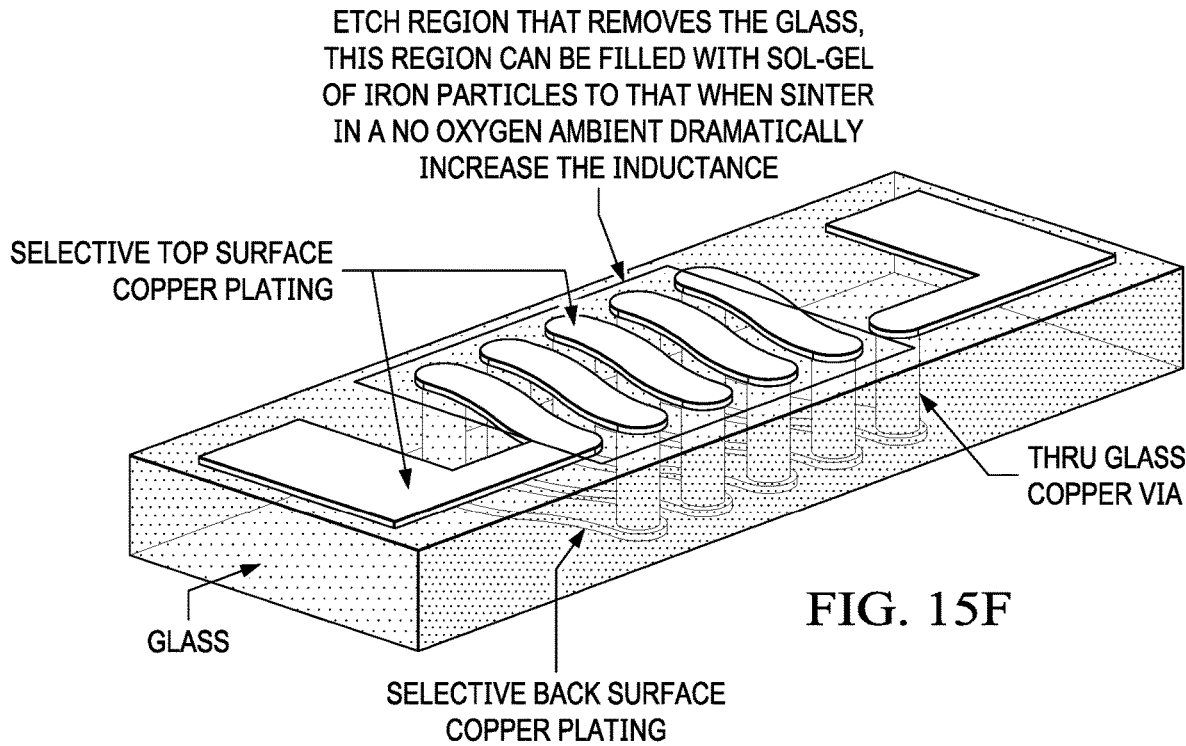

FIGS. 15A-15F show further processing steps for making a device using the present invention. FIG. 15A shows the copper filled through glass structures (via and interdigitated lines) and the APEX glass substrate is exposed using a second photo mask that has a patterns to connect the via for the inductors and finish the interdigitated pattern for the capacitor. FIG. 15B shows a cross-sectional view of the inductor. The intensity is of 310 nm light is 0.1 J/cm2, the wafer is the baked at 600° C. in argon for 30 min as described above. FIGS. 15A and 15B show that this converts the first few microns of the exposed glass to ceramic. The wafer is placed into a dilute HF bath exposing metallic silver. The wafer is the place into a copper plating solution that selectively metallizes the exposed silver/etched regions. FIG. 15C shows the next step in which an additional photo exposure and etch can be accomplished to remove the glass/ceramic material between the interdigitated electrodes of the capacitor to improve the Quality Factor or Q of the Capacitor. FIG. 15D shows the next step in which an additional photo exposure and etch can be accomplished to remove the glass/ceramic material between the interdigitated electrodes and filled with a high k media to dramatically increase the capacitance to improve the Quality Factor of the capacitor. FIG. 15E shows the next step in which an addition photo exposure and etch can be accomplished to remove the glass/ceramic material identified as the material with in the rectangular outline of the inductor to enable the coils to be free standing to improve the Quality Factor or Q of the inductor. FIG. 15F shows the next step in which an addition photo exposure and etch can be accomplished to remove the glass/ceramic material identified as the material with in the rectangular outline or outside of the rectangular outline of the inductor. This region can be filled with magnetic particles that can be sintered under an inert gas to create an magnetic core inductor. This enables the integrated inductor with much higher levels of inductance.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method for creating a system-in-package with integrated lumped element devices formed in or on photodefinable glass comprising the steps of:
   masking a design layout comprising one or more structures to form one or more electrical components on or in a photodefinable glass substrate;
   exposing at least one portion of the photodefinable glass substrate to an activating energy source;
   heating the photodefinable glass substrate for at least ten minutes above a glass transition temperature thereof;
   cooling the photodefinable glass substrate to transform at least a part of the exposed glass to a crystalline material to form a glass-crystalline substrate;
   etching the glass-crystalline substrate with an etchant solution to form one or more channels in the glass-crystalline substrate, wherein the glass-crystalline substrate is adjacent to the one or more channels; and
   depositing, growing, or selectively etching to create a seed layer on a surface of the glass-crystalline substrate exposed during the etching step to enable electroplating of copper to fill the one or more channels and deposit on the surface of the photodefinable glass,
   wherein the integrated lumped element devices reduce parasitic noise and losses by at least 25% compared to an equivalent surface mounted device that is not in or on photodefinable glass.

2. The method of claim 1, further comprising forming an isolator in the system-in-package.

3. The method of claim 1, further comprising forming a circulator in the system-in-package.

4. The method of claim 1, further comprising forming an RF filter in the system-in-package.

5. The method of claim 4, wherein the RF filter is a low-pass filter, a high-pass filter, a notch filter, or a band-pass filter.

6. The method of claim 1, further comprising forming a power combiner or a power splitter in the system-in-package.

7. The method of claim 1, wherein the system-in-package eliminates at least 30% of an RF parasitic signal when compared to the equivalent surface mounted device.

8. The method of claim 1, wherein the system-in-package eliminates at least 35% of an RF parasitic signal when compared to the equivalent surface mounted device.

9. The method of claim 1, antennas, impedance matching elements, 50-ohm termination elements, integrated ground planes, RF shielding elements, EMI shielding elements, RF combiners, RF splitters, transformers, switches, or diplexers.

10. The system-in-package created by the method of claim 1.

11. The system-in-package of claim 10, wherein the system-in-package comprises an isolator.

12. The system-in-package of claim 10, wherein the system-in-package comprises a circulator.

13. The system-in-package of claim 10, wherein the system-in-package comprises an RF filter.

14. The system-in-package of claim 13, wherein the RF filter is a low-pass filter, a high-pass filter, a notch filter, or a band-pass filter.

15. The system-in-package of claim 10, wherein the system-in-package of claim 10, wherein the system-in-package is a power combiner or a power splitter.

16. The system-in-package of claim 10, wherein the system-in-package is an RF circuit that eliminates at least 30% of an RF parasitic signal loss when compared to the equivalent surface mounted device.

17. The system-in-package of claim 10, wherein the system-in-package is an RF circuit that eliminates at least 35% of an RF parasitic signal loss when compared to the equivalent surface mounted device.

18. The system-in-package of claim 10, wherein the system-in-package is an RF circuit that eliminates at least 50% of an RF parasitic signal loss when compared to the equivalent surface mounted device.

19. The system-in-package of claim 10, wherein the system-in-package comprises one or more antennas, impedance matching elements, 50-ohm termination elements, integrated ground planes, RF shielding elements, EMI shielding elements, RF combiners, RF splitters, transformers, switches, or diplexers.

20. The method of claim 1, wherein the system-in-package eliminates at least 50% of an RF parasitic signal when compared to the equivalent surface mounted device.

21. The method of claim 1, further comprising converting the glass-crystalline substrate adjacent to the one or more channels to a ceramic phase.

22. A method for creating a system-in-package system in a package with integrated lumped element devices formed in or on photodefinable glass comprising the steps of:
   masking a design layout comprising one or more structures to form one or more electrical components on or in a photodefinable glass substrate;
   transforming at least a part of the exposed glass to a crystalline material to form a glass-crystalline substrate;
   etching the glass-crystalline substrate with an etchant solution to form one or more channels in the glass-crystalline substrate, wherein the glass-crystalline substrate is adjacent to the one or more channels; and
   depositing, growing, or selectively etching a seed layer on a surface of the glass-crystalline substrate exposed during the etching step to enable electroplating of copper to fill the one or more channels and deposit on the surface of the photodefinable glass,
   wherein the integrated lumped element devices reduce parasitic noise and losses by at least 25% compared to an equivalent surface mounted device that is not in or on photodefinable glass.

23. The method of claim 22, further comprising forming an RF filter in the system-in-package.

24. The method of claim 23, wherein the RF filter is a low-pass filter, a high-pass filter, a notch filter, or a band-pass filter.

25. The method of claim 22, further comprising forming a power combiner or a power splitter in the system-in-package.

26. The method of claim 22, wherein the system-in-package eliminates at least 30% of an RF parasitic signal when compared to the equivalent surface mounted device.

27. The method of claim 22, wherein the system-in-package eliminates at least 35% of an RF parasitic signal when compared to the equivalent surface mounted device.

28. The method of claim 22, wherein the system-in-package eliminates at least 50% of an RF parasitic signal when compared to the equivalent surface mounted device.

29. The method of claim 22, further comprising forming one or more antennas, impedance matching elements, 50-ohm termination elements, integrated ground planes, RF shielding elements, EMI shielding elements, RF combiners, RF splitters, transformers, switches, or diplexers.

30. The method of claim 22, further comprising forming an isolator in the system-in-package.

31. The method of claim 22, further comprising forming a circulator in the system-in-package.

32. The method of claim 22, further comprising converting the glass-crystalline substrate adjacent to the one or more channels to a ceramic phase.

* * * * *